United States Patent [19]

Hikmet et al.

[11] Patent Number: 5,297,173
[45] Date of Patent: Mar. 22, 1994

[54] PHASE/FREQUENCY COMPARATOR FOR TIMING RECOVERING CIRCUIT

[75] Inventors: Sari Hikmet, Creteil; Hervé F. Houeix, Lannion, both of France

[73] Assignee: SAT (Société Anonyme de Telecommunications), Paris, France

[21] Appl. No.: 836,872

[22] Filed: Feb. 19, 1992

[30] Foreign Application Priority Data

Feb. 22, 1991 [FR] France .................. 91-02175

[51] Int. Cl.$^5$ .............................. H04L 7/033
[52] U.S. Cl. ................... 375/118; 331/11; 331/25
[58] Field of Search .............. 375/118, 119, 120; 331/11, 25, 17, 1 R, 1 A; 370/105.3; 307/269, 231; 328/133, 134

[56] References Cited

U.S. PATENT DOCUMENTS

| 4,605,908 | 8/1986 | Broughton | 331/11 |
| 4,672,329 | 6/1987 | Hikawa | 331/11 |
| 4,803,705 | 2/1989 | Gillingham et al. | 331/11 |
| 5,015,970 | 5/1991 | Williams et al. | 331/11 |

FOREIGN PATENT DOCUMENTS 54322 6/1982 European Pat. Off. .

OTHER PUBLICATIONS

"A Self Correcting Clock Recovery Circuit" by Charles R. Hogge, Jr. *Journal of Lightwave Technology*, vol. LT-3, No. 6, Dec., 1985 pp. 1312-1314.

*Primary Examiner*—Stephen Chin
*Assistant Examiner*—Hai H. Phan
*Attorney, Agent, or Firm*—Laubscher & Laubscher

[57] ABSTRACT

The phase/frequency comparator comprises a known phase comparator for comparing the phases of an digital input signal with a clock signal of which the period varies to within one time interval with respect to the period of the input signal. Such a phase comparator produces a first error signal whose sign, and preferably magnitude, vary as a function of the difference between the phases. The phase/frequency comparator is intended to produce a second error signal which replaces the first error signal and whose sign, and preferably magnitude, vary as a function of the difference between the periods. According to a preferred embodiment, a phase shift assessing circuit detects a predetermined phase shift, e.g. substantially equal to 0, between the clock signal and the input signal during a clock period. A sign detecting circuit detects the sign of the difference between the periods for the predetermined phase shift, and a logic circuit derives two signals having pulse widths as a function of said periods thereby deriving the second error signal by differentiation. The phase/frequency comparator is particularly intended for a phase locked loop for recovering the timing of the input signal.

18 Claims, 12 Drawing Sheets

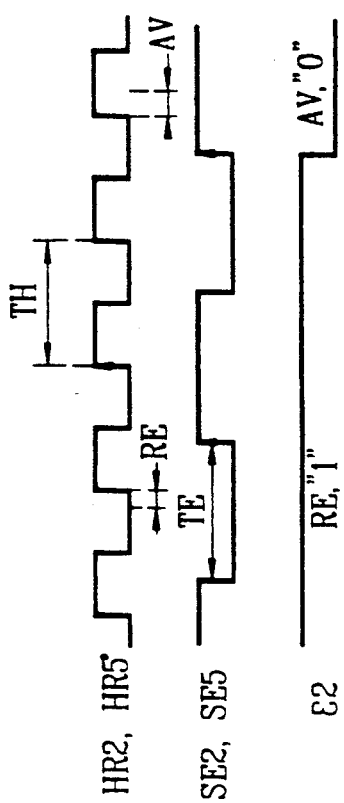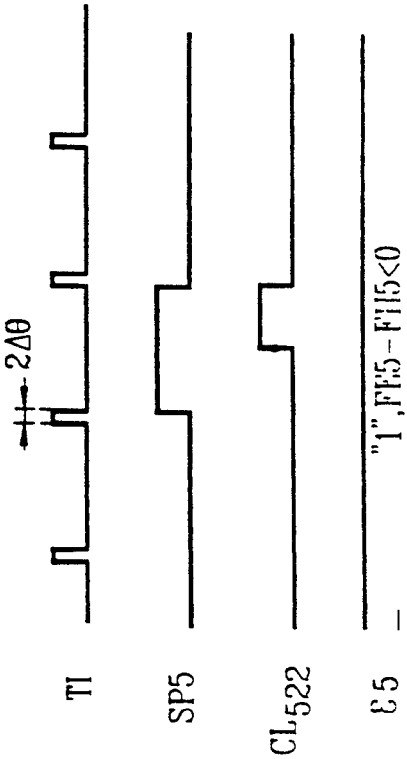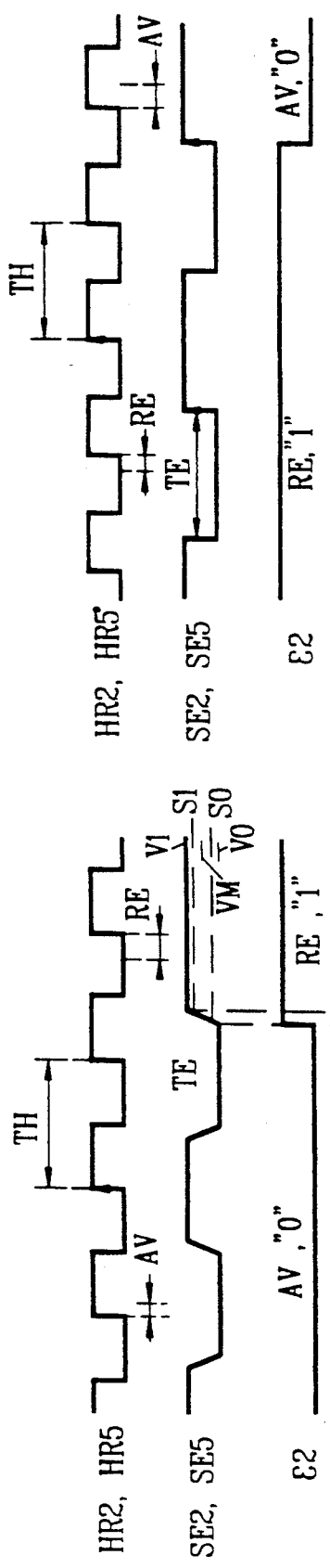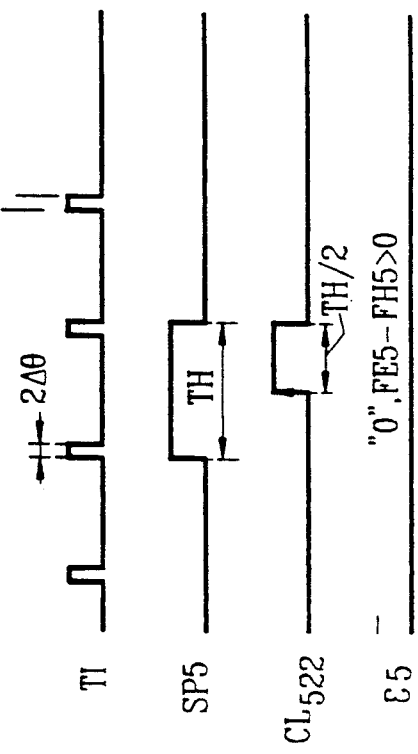

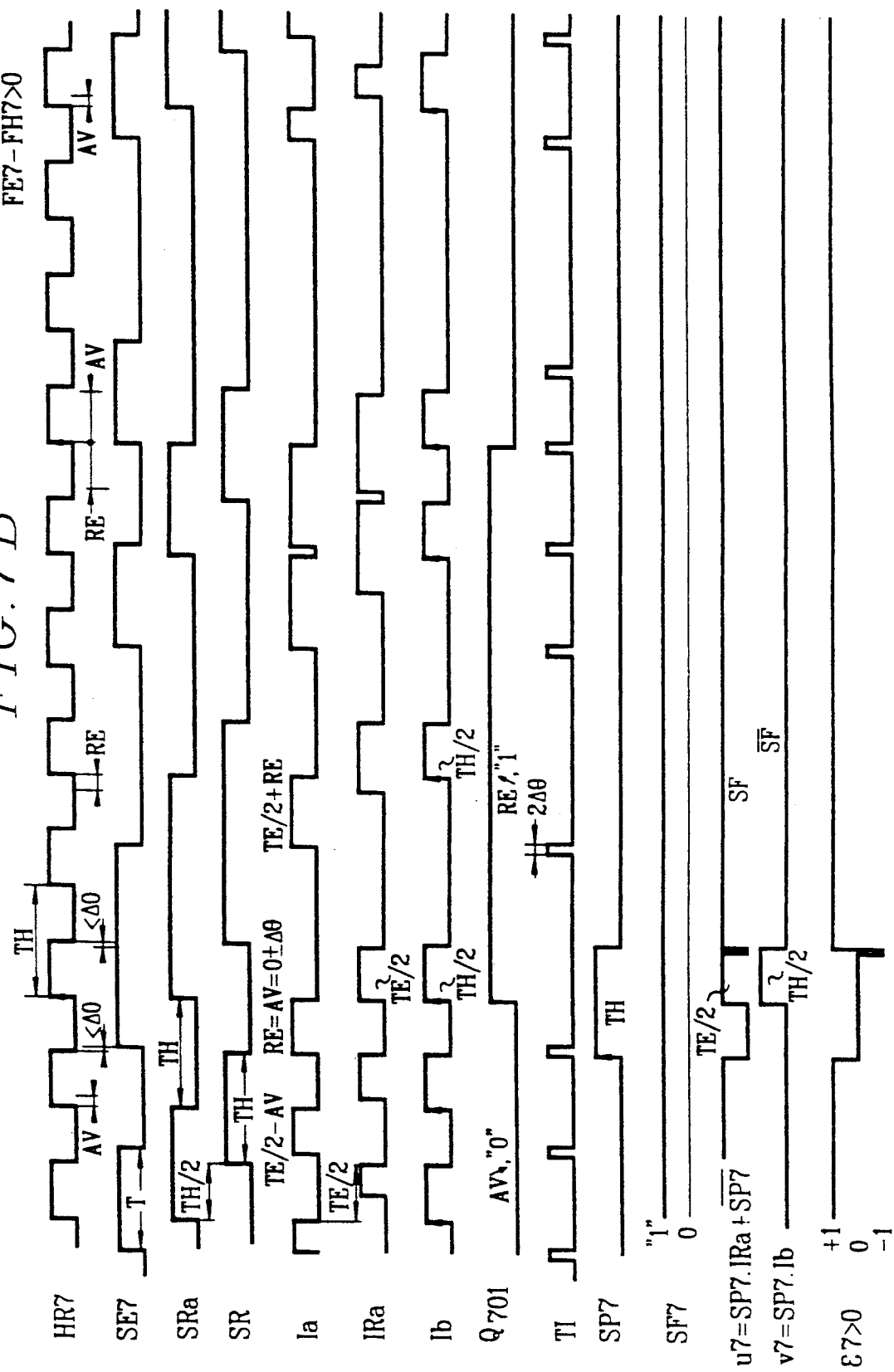

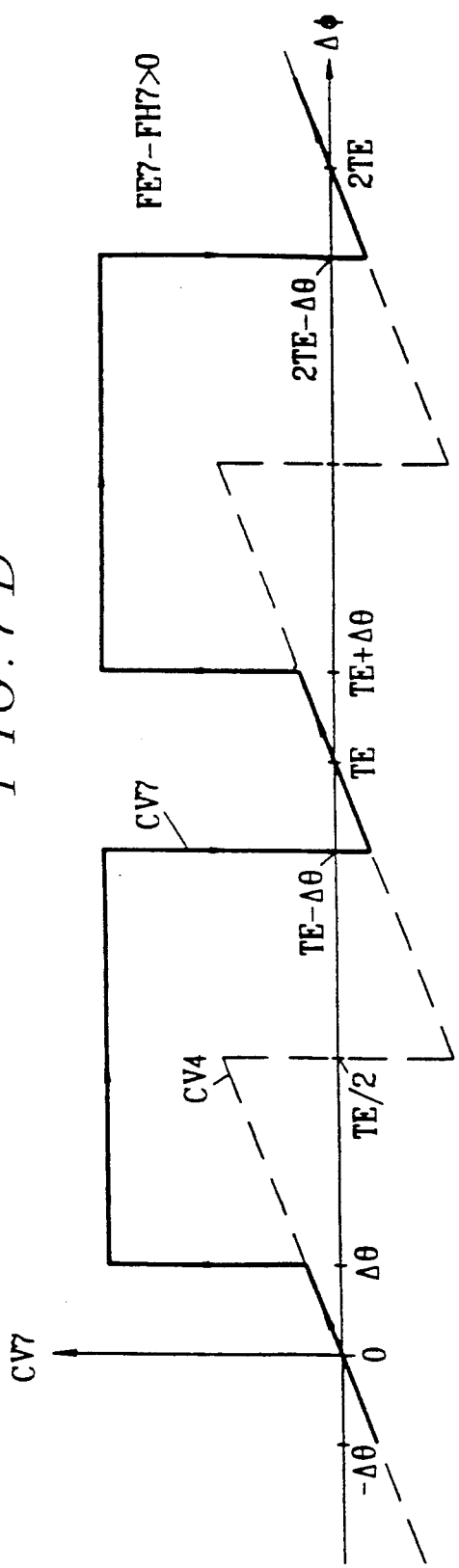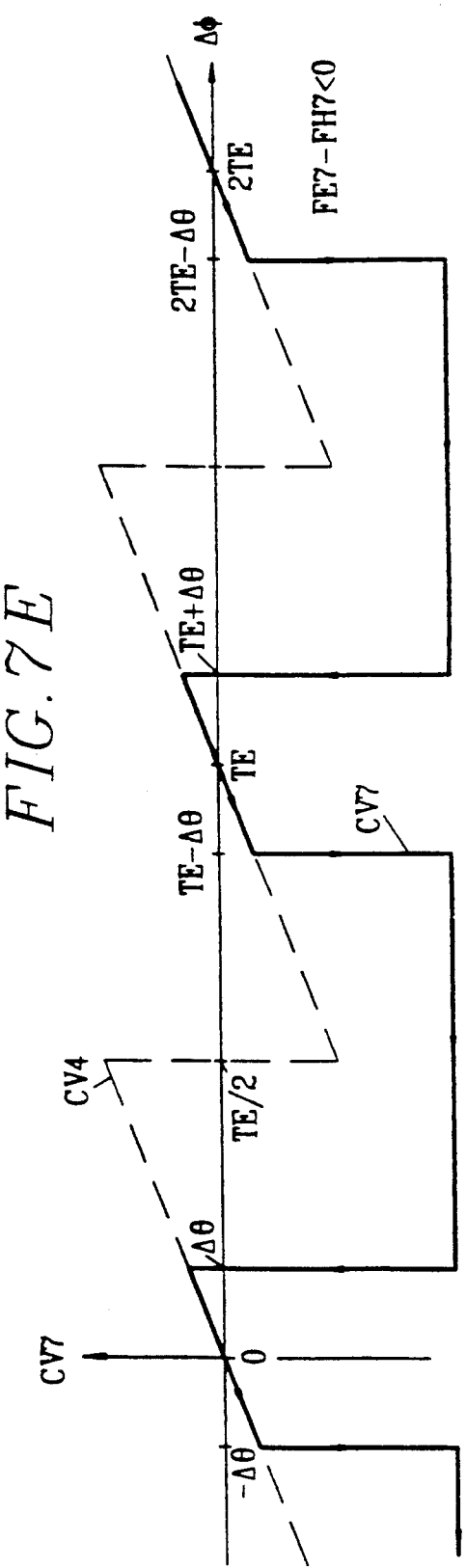

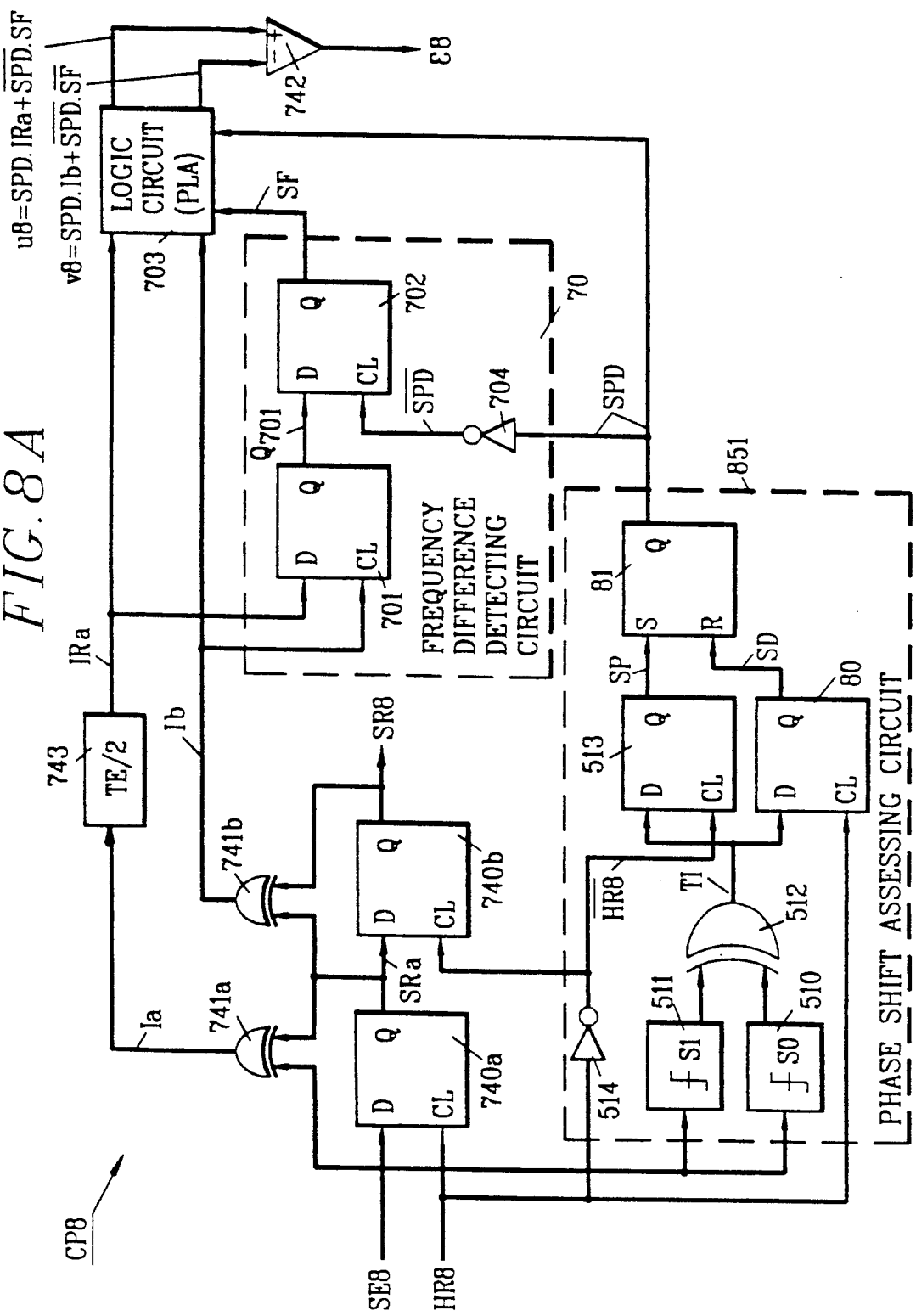

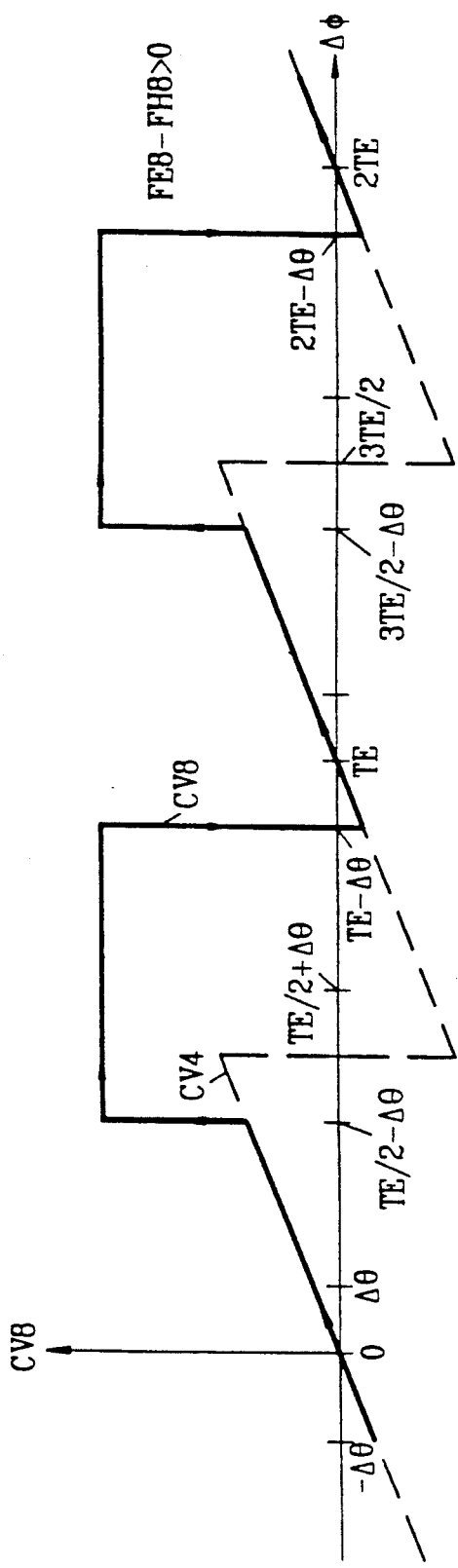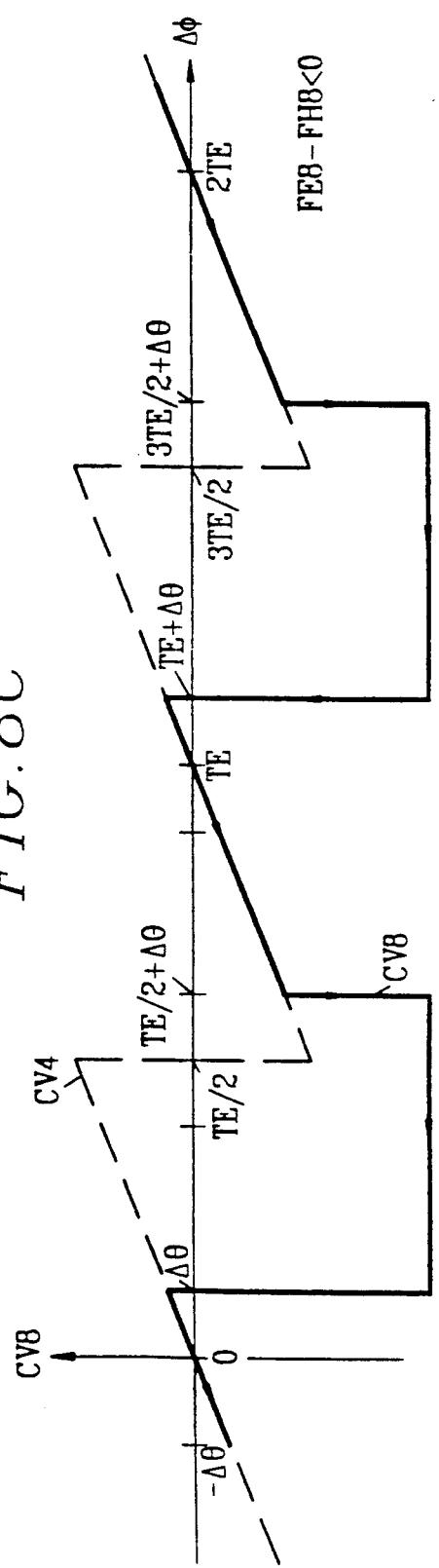

PHASE/FREQUENCY COMPARATOR FOR TIMING RECOVERING CIRCUIT

BACKGROUND OF THE INVENTION

1. Field of the Invention

This invention relates in general to the recovery of the timing of a digital input signal at a receiving end of a digital communication network, and more particularly to a phase/frequency comparator included in a timing recovering circuit.

A basic function of any receiver included in a digital transmission system is to recover a local clock signal to regenerate the bits of a received digital input signal The receiving end decides the probable value of a binary element of said input signal by sampling the input signal as a function of the clock signal. The input signal is e.g. a video signal transmitted in a digital form via an optical fiber medium.

2. State of the Prior Art

The timing (or clock) recovering circuit is usually devised in the form of a phase locked loop.

Such a timing recovering circuit essentially comprises a phase comparator, an intermediary means principally for low pass filtering, and a voltage-controlled local oscillator producing a clock signal. The characteristics of the recovering circuit depend notably on the comparator used. As one of the essential problems with digital transmission is the generation of the clock signal for sampling the input signal received in the receiving end, the frequency and phase of the clock signal must be synchronized with those of the input signal.

The local clock signal is initially asynchronous with the input signal, and the timing recovering circuit is intended to lock the clock signal onto the frequency of said input signal.

The frequency locking takes places at the end of an acquisition process if the initial difference between the respective frequencies of the clock and input signals at the transmission and receiving ends is lower than a predetermined value, the latter being a function of parameters of the timing recovering circuit.

The maximum frequency difference for which the locking of the local clock signal with the received input signal is acquired is called the acquisition or locking range. For the timing recovering circuit in the receiving end to function properly, the acquisition range must be greater than an uncertainty interval related to the precision of the oscillator used in the transmission end.

For instance, for a 140-Mbit/s transmission system in which a transmission end uses a clock with a frequency precision of $\pm 10^{-4}$, the acquisition range of the local oscillator must not be less than $2 \times 140 \times (10^3 \times 10^{-4}) = 28$ kHz.

In this way, proper functioning of the receiving circuit is guaranteed for given variations of the transmission frequency by "matching" the local oscillator in the receiving end to the frequency of the signal received during the acquisition process in response to e.g. a frequency jump.

After this frequency locking is achieved, the recovered local clock signal must have low phase jitter. Indeed, phase shifts between the locked regenerated clock signal and the received signal to be regenerated must be sufficiently low to avoid deteriorating the performance of the transmission system in the steady state after frequency acquisition.

In the state of the prior art, increasing of the frequency acquisition range and decreasing of phase noise in the steady state are antagonistic constraints, and in a large number of applications it is difficult or even impossible to find a happy medium without recourse to acquisition aiding techniques.

Frequency sweeping is a known acquisition aiding technique which consists, during the acquisition process, in sweeping the nominal frequency of the local oscillator over the uncertainty interval of the frequency of the received signal, by means of an external signal which is inhibited as soon as the acquisition is achieved. The timing recovering circuit is then locked onto the frequency of the received signal. However, it is a well known fact to those skilled in the art that frequency sweeping has the disadvantage of slowing down the acquisition process, especially in a transmission chain comprising several timing recovering circuits. The present invention was developed to avoid the preceding disadvantages, according to the prior art.

SUMMARY OF THE INVENTION

The primary object of the present invention is to provide a phase/frequency comparator to be included in a timing recovering circuit in order for this circuit to enable wide frequency acquisition ranges and to guarantee low phase jitter in the regenerated clock signal.

According to a more specific object of the invention, a phase/frequency comparator comprises phase comparing means for comparing the phases of a digital input signal having a predetermined binary period and of a clock signal having a clock period variable to within a predetermined time interval with respect to the binary period, thereby deriving a first error signal whose sign is a function of the sign of the phase difference between the input signal and the clock signal, phase shift assessing means for detecting a predetermined phase shift between the clock signal and the input signal to within the predetermined time interval during a clock period, thereby deriving a phase detection signal, and means for modifying the first error signal into a second error signal of which the sign is a function of the sign of the difference between the binary period and the clock period, in response to the phase detection signal.

For simplifying the comparator circuitry, the predetermined phase shift is preferably substantially equal to zero, to within the predetermined time interval of the clock period. In this case, the phase assessing means comprises means for detecting transitions between logic states in the input signal thereby deriving transition pulses having a width substantially equal to the time interval, and means for deriving a pulse of the phase detection signal having a width equal to at least one clock period in response to a transition pulse substantially in phase with a clock signal complementing said clock signal.

According to another embodiment, the phase assessing means detect several predetermined phase shifts between the clock signal and the input signal during several respective clock periods to derive the phase signal even when the input signal comprises series of consecutive bits having the same logic state. For instance, the predetermined phase shifts can be substantially equal to 0 and $\pi$ modulo-$2\pi$.

The means for modifying the first error signal into the second error signal depend on the type of the phase comparing means.

When the phase comparing means are of the sign type, i.e., when the first error signal has two logic states or polarities representing the sign of the phase shift between the input signal and the clock signal, the modifying means comprises means for reproducing at least one period of the clock signal in response to the phase detection signal, and means for reading the sign of the first error signal in response to the reproduced period of the clock signal thereby deriving the second error signal. The second error signal then has states that are representative of the sign of the difference in frequencies between the clock signal and the input signal.

The phase comparing means that are included in a phase/frequency comparator embodying the invention can be of the linear type. The sign and magnitude of the first error signal vary as a function of the phase shift between the clock signal and the input signal. The phase comparing means comprise means for deriving first pulses having widths that vary as a function of the phase shift between the clock signal and the input signal, means for deriving second pulses having widths proportional to the clock period, and a differential amplification means. The modifying means comprise means for comparing the widths of the first and second pulses in response to the phase detection signal, thereby deriving a logic sign signal of which the states are representative of the sign of the difference between the binary period and the clock period, and means for selecting first and second pulses during at least one clock period determined by the phase detection signal, thereby deriving first and second signals reproducing the first and second selected pulses contained in the determined clock period, and the state of the sign signal and the opposite state of the sign signal before and after the determined clock period, respectively, said first and second signals being applied to said differential amplification means which produces the second error signal.

This invention relates also to a timing recovering circuit comprising a phase locked loop circuit including a phase comparator which is a phase/frequency comparator embodying the invention.

BRIEF DESCRIPTION OF THE DRAWINGS

Further features and advantages of the invention will be apparent from the following more particular description of several preferred embodiments of this invention as illustrated in the corresponding accompanying drawings in which:

FIGS. 2B and 2C are signal timing diagrams of signals relating to the first phase comparator;

FIGS. 5B and 5C are timing diagrams of signals relating to the comparator in FIG. 5A, respectively, when the frequency of the input signal is higher and lower than the frequency of the recovered clock signal, in correspondence with FIGS. 2B and 2C;

FIG. 7B and 7C are timing diagrams of signals relating to the comparator in FIG. 7A, respectively, when the frequency of the input signal is higher and lower than the frequency of the recovered clock signal;

FIGS. 7D and 7E show two diagrams of oscillator control signal as a function of the phase shift between input signal and clock signal, respectively, relating to positive and negative frequency differences between input signal and clock signal for the phase/frequency comparator in FIG. 7A;

FIG. 8A is a block diagram of a second linear-type phase/frequency comparator embodying the invention; and FIGS. 8B and 8C show two diagrams of oscillator control signal as a function of the phase shift between input signal and clock signal, respectively, relating to positive and negative frequency differences between input signal and clock signal for the phase/frequency comparator in FIG. 8A.

DESCRIPTION OF THE PREFERRED EMBODIMENTS

Figure 1:
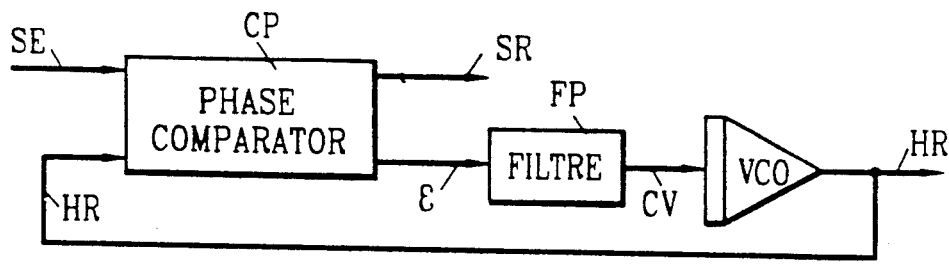
FIG. 1 is a schematic block diagram of a timing recovering circuit with a phase locked loop embodying the prior art.

In reference to FIG. 1, a known timing recovering circuit of the phase locked loop type comprises a phase comparator CP, a low pass filter FP and a voltage-controlled local oscillator VCO. The oscillator output produces a recovered clock signal HR applied at a first input of the comparator. A second input of the comparator CP receives a digital input signal SE to be regenerated. The comparator supplies an error signal $\epsilon$ as a function of the phase shift between the recovered clock signal HR and the input signal SE. A regenerated input signal SR in phase with the clock signal HR is also produced by the comparator CP. The filter FP or any other filtering means with digital/analog components and a frequency multiplier or divider performs a two-fold function consisting in stabilizing of oscillator control voltage CV and rejecting high-frequency components of the error signal $\epsilon$. The recovered clock signal HR is slaved to the input signal SE so as to derive sampling instants of the digital input signal. Depending on whether the clock signal is earlier or later in phase than the input signal, a corresponding phase correction represented by the amplitude of the control signal CV is applied to the controlled oscillator.

Figure 2A:
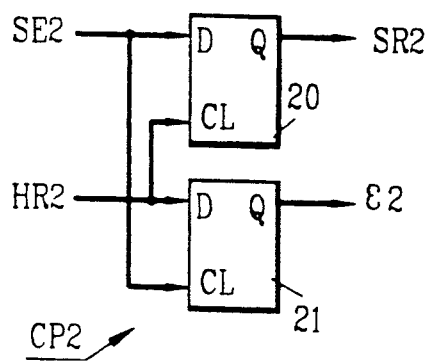
FIG. 2A is a block diagram of a first sign-type phase comparator embodying the prior art.
Figure 3:
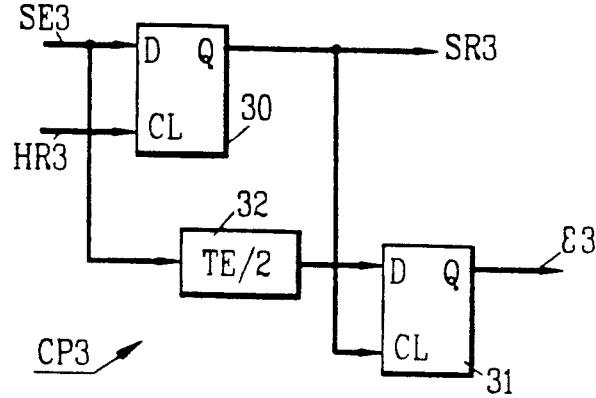
FIG. 3 is a block diagram of a second sign-type phase comparator embodying the prior art.
Figure 4A:
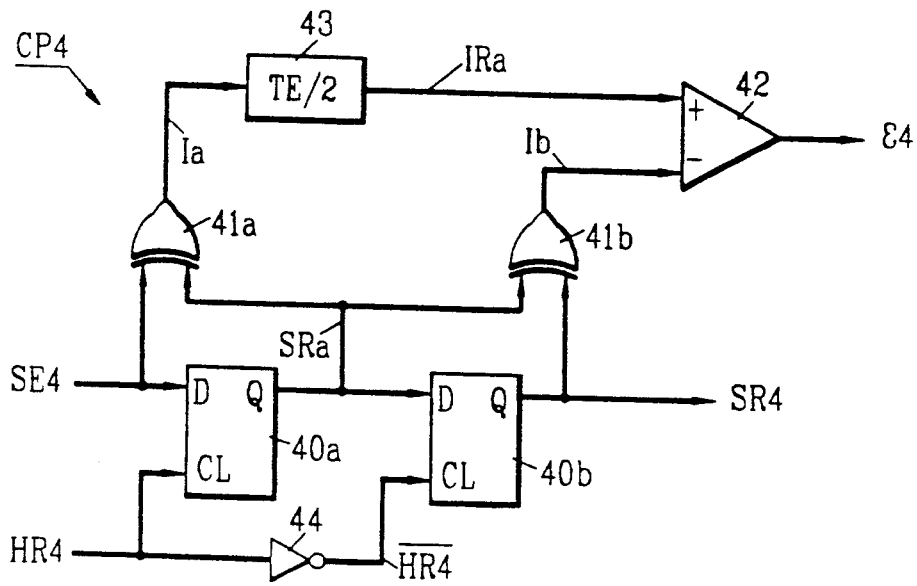
FIG. 4A is a block diagram of a linear-type phase comparator embodying the prior art.

FIGS. 2A, 3 and 4A, respectively, show phase comparators CP2, CP3 and CP4 embodying the prior art and comprising D-type flip-flops.

The simplest of these, comparator CP2, comprises two D flip-flops 20 and 21 as shown in FIG. 2A.

The first flip-flop 20 receives the digital input signal SE2 to be regenerated and the recovered clock signal HR2 supplied by the local oscillator VCO via an input D and a clock input CL respectively. An output Q of the flip-flop 20 produces a regenerated digital signal SR2.

The second flip-flop 21 has an input D connected to the output of the voltage-controlled local oscillator VCO for receiving the recovered clock signal HR2, and a clock input CL receiving the input signal to be regenerated SE2. Rising edges of the signal SE2 thus sample the clock signal HR2 into an error signal $\epsilon 2$ produced by an output Q of the flip-flop 21. As shown on the left of FIG. 2B and on the right of FIG. 2C, when the recovered clock signal is earlier in phase AV than the input signal, i.e., when the rising edges of the clock signal are advanced with regard to the middle of the binary periods of the input signal, the error signal $\epsilon 2$ is in the state "0" so as to retard the recovered clock signal by the local oscillator. In the case of phase lag RE shown on the right of FIG. 2B and on the left of FIG. 2C, the error signal $\epsilon 2$ is in the state "1" so as to advance the clock signal HR2. The comparator CP2 thus supplies an error signal $\epsilon 2$ of which the logic states are representative of the sign of the phase difference between the recovered clock signal HR2 and the input signal SE2 for rephasing the clock signal for the rising edges of the clock signal to coincide with the middle of the binary periods TE of the digital input signal SE2. A comparator such as the comparator CP2 is referred to as a "sign-type phase comparator".

FIG. 3 shows another sign-type phase comparator CP3 comprising two D flip-flops 30 and 31 and a TE/2 delay line 32. The first flip-flop 30 is equivalent to the flip-flop 20 and derives at output Q a regenerated digital signal SR3 as a function of a digital input signal SE3 and of a recovered clock signal HR3 respectively applied to inputs D and CL of the flip-flop 30. The input CL of the second flip-flop 31 is connected to the output Q of the flip-flop 30. Input D of the flip-flop 31 receives the signal SE3 via the delay line 32. The input signal SE3 is put in phase with respect to the recovered clock signal HR3 in the first flip-flop 30 thereby deriving a regenerated signal SR3, and is phase shifted by TE/2 via the delay line 32 thereby deriving a phase shifted signal. The regenerated signal and the phase-shifted signal are respectively applied to the clock input CL and to the input D of the second flip-flop 31 of which output Q generates an error signal $\epsilon 3$. The signal $\epsilon 3$ is in the state "1" if the recovered clock signal is later in phase than the input signal, and in the state "0" if the recovered clock signal is earlier in phase than the input signal. The output Q of the flip-flop 30 slaves the local oscillator VCO depending on the phase of the input signal.

The error signal in the comparator CP3 is thus derived in relation to the rising edges of the regenerated signal SR3 which is in phase with the clock signal HR3 and which is compared with input signal which is phase shifted by a binary half-period TE/2.

At the output, the two phase comparators CP2 and CP3 only generate error signals having "0" and "1" states representative of the sign of the phase difference between the recovered clock signal and the input signal so as to slave the local oscillator VCO to the phase of the input signal.

A phase comparator CP4 whose error signal $\epsilon 4$ indicates the magnitude of the phase difference between the recovered clock signal HR4 and the input signal SE4 as well as the sign of the difference between these two signals is described in the article by Charles. R. Hogge Jr., entitled "A Self Correcting Clock Recovery Circuit", published in the Journal of Lightwave Technology, Vol. LT-3, pages 1312-1314, Dec. 1985 (also FIG. 7 in to U.S. Pat. No. 4,422,176).

As shown in FIG. 4A, the Hogge comparator CP4 comprises two cascade-connected D flip-flops 40a and 40b, two XOR (Exclusive-OR) gates 41a a and 41b, a differential amplifier 42, a TE/2 delay line 43 and an inverter 44. The input D of the flip-flop 40a receives the digital input signal SE4. The recovered clock signal HR4 leaving the local oscillator VCO is directly applied via the inverter 44 to the clock inputs CL of the flip-flops 40a and 40b respectively. The output Q of the flip-flop 40b, whose input D is connected to the output Q of the flip-flop 40a, derives the regenerated signal SR4. The two inputs of the XOR gates 41a and 41b are respectively connected to input D and output Q of the flip-flops 40a and 40b. The outputs of the gates of the differential amplifier 42 respectively via the inputs of the differential amplifier 42 respectively via the delay line 43 and directly. At output, the differential amplifier 42 derives an error signal $\epsilon 4$ whose positive or negative level represents the time average value of the phase difference between the input signal and the recovered clock signal. This time average value is obtained by smoothing of the signal $\epsilon 4$ in the active filter Fp into a signal CV4 slaving the phase of the recovered clock HR4 to the phase of the input signal SE4.

According to another embodiment, the delay line can be placed between the input D of the flip-flop 40a and the first input of the gate 41a without modifying the functioning of the comparator CP4.

Figure 4B:
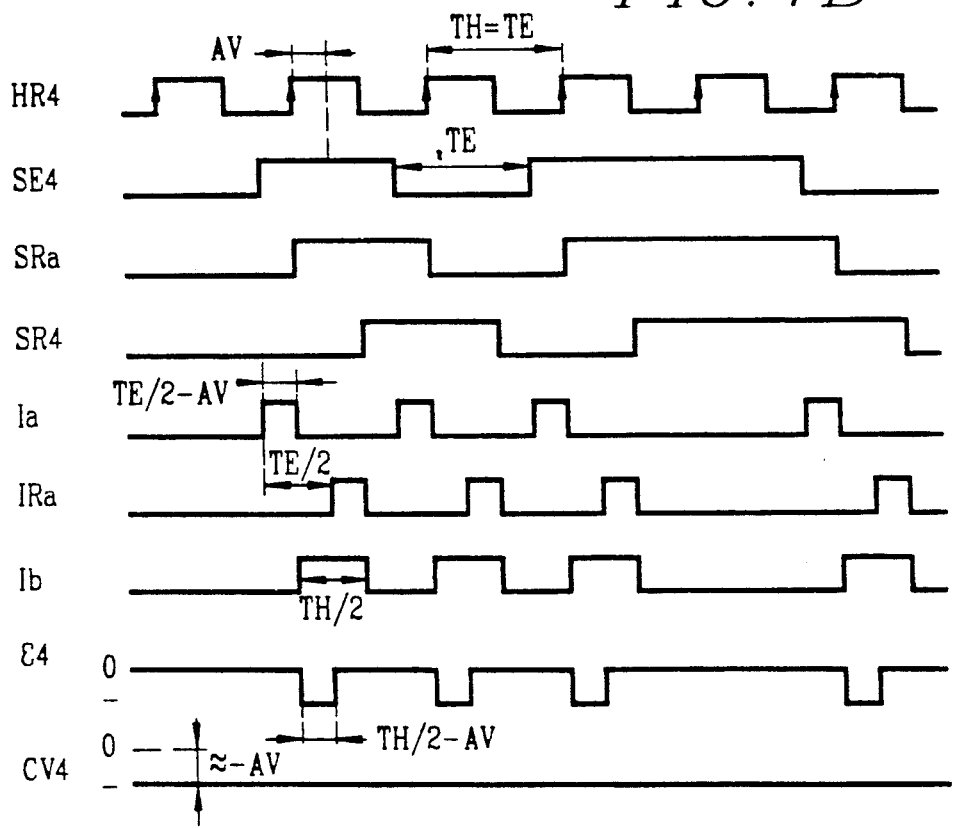
FIGS. 4B and 4C are timing diagrams of signals relating to the phase comparator in FIG. 4A, respectively, when the recovered clock signal is advanced and retarded with regard to the digital input signal.

In reference to FIG. 4B in which the signal HR4 is presupposed in advance with respect of signal SE4 and in which the periods TH and TE are equal, the first XOR gate 41a in the comparator CP4 generates pulses Ia of which the rising edges are synchronous with those of the input signal SE4 and of which the width is variable. This width is equal to (TE/2−AV) when the signal HR4 is in advance by AV. At output, the second XOR gate 41b generates pulses Ib having a constant width equal to a binary half-period TE/2 of the input signal SE4. The rising edges of the pulses Ib coincide with the rising edges of the clock signal HR4 and therefore with the falling edges of the pulses Ia at output of the first XOR gate. The pulses Ia are retarded by the binary half-period TE/2 in the delay line 43 in order to form pulses IRa with falling edges coinciding with those of the pulses Ib.

Under these conditions, the time shift between the rising edges of the pulses Ia and Ib is precisely equal to the magnitude of the phase shift AV between the signals SE4 and HR4 The mean amplitude of the negative error signal $\epsilon 4$ for controlling the voltage-controlled oscillator is then directly proportional to the advance AV, as shown on the last line of FIG. 4B. The penultimate line of FIG. 4B shows the negative difference signal $\epsilon 4 = IRa − Ib$ whose crenels of width AV are smoothed over a period greater than TE to obtain the control signal CV4.

Figure 4C:
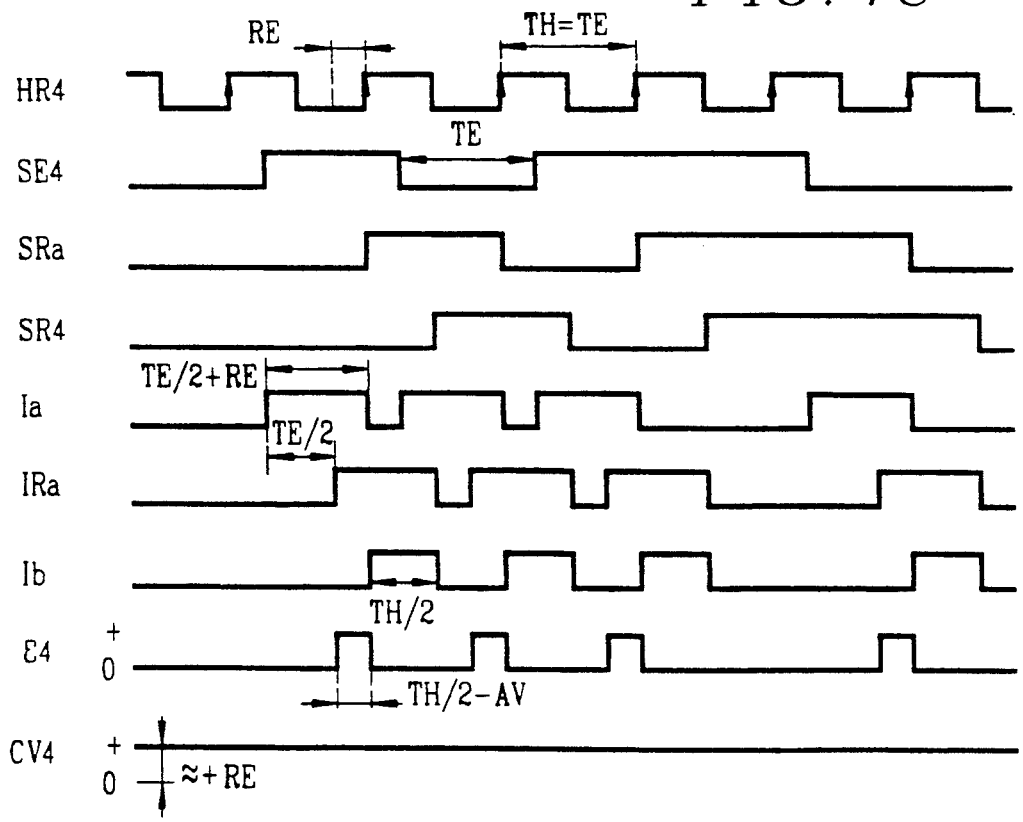

When the signal HR4 is retarded by RE with regard to the signal SE4, as shown in FIG. 4C, the pulses Ia and IRa have a width equal to TE/2+RE, and the positive error signal $\epsilon 4$ produced by the differential amplifier 42 has a mean magnitude 1 proportional to the lag RE.

The different phase comparators presented above are frequently used to devise a phase locked loop. Nevertheless, a fundamental problem in devising such a phase loop consists in ensuring both a sufficiently wide frequency acquisition range and a sufficiently narrow noise range (unstable oscillations) in the region of a stable state. The frequency precision of the oscillators in certain applications requires a frequency acquisition range that is not compatible with the steady state jitter constraints around a stable state of the phase loop. The most widely used method of devising the loop consists on the one hand in selecting the loop parameters to satisfy jitter specifications, in which case the transfer function of the loop ensures stability of the regenerated clock signal in the region of the stable state, and, on the other hand, in the use of an acquisition aiding technique to increase the frequency acquisition range. As previously stated, frequency sweeping is the most common acquisition aiding technique. This consists in adding a periodical signal, having sufficient amplitude to sweep the frequency of the oscillator, to the signal leaving the loop filter. However, in order for this frequency acquisition to take place, the sweeping speed must be slow, which has the disadvantage of slowing down the acquisition process.

To intuitively explain that the increasing of the frequency acquisition range and the decreasing of the phase noise are antagonistic constraints in a phase locked loop, one must conceive that a wide acquisition range requires the utilization of a loop such that the recovered clock frequency stabilizes very quickly to a stable state in response e.g. to a frequency jump. In this case, however, for phase shifts of the input signal received around stable points defined by the recovered clock, the behavior of the phase loop generates phase noises through "lack of inertia" around the stable points. Indeed, "sudden" re-phasings cause phase noises that deteriorate transmission.

Another acquisition aiding technique of greater interest consists in replacing, as embodied by the invention, the phase comparator with a phase/frequency comparator. A phase comparator differs from a phase/frequency comparator in that the latter produces, in "open loop" manner, a DC voltage having a same sign as the frequency difference to be compensated between the recovered clock signal and the received input signal. As soon as the loop is closed, this voltage is applied to the voltage-controlled oscillator and enables very fast locking of the oscillator frequency onto that of the received input signal.

The phase/frequency comparators embodying the invention are intended to recover the timing of a digital input signal and permit wide acquisition ranges and low phase noises in the region of stable states.

The comparators embodying the invention described hereinunder implement the following principle. A phase comparator can be transformed into a phase/frequency comparator by only enabling the output of said phase comparator when the phase error is included within a predetermined interval centered around a stable point, which means that the phase shift between the recovered clock signal and the received input signal is small.

Figure 5A:
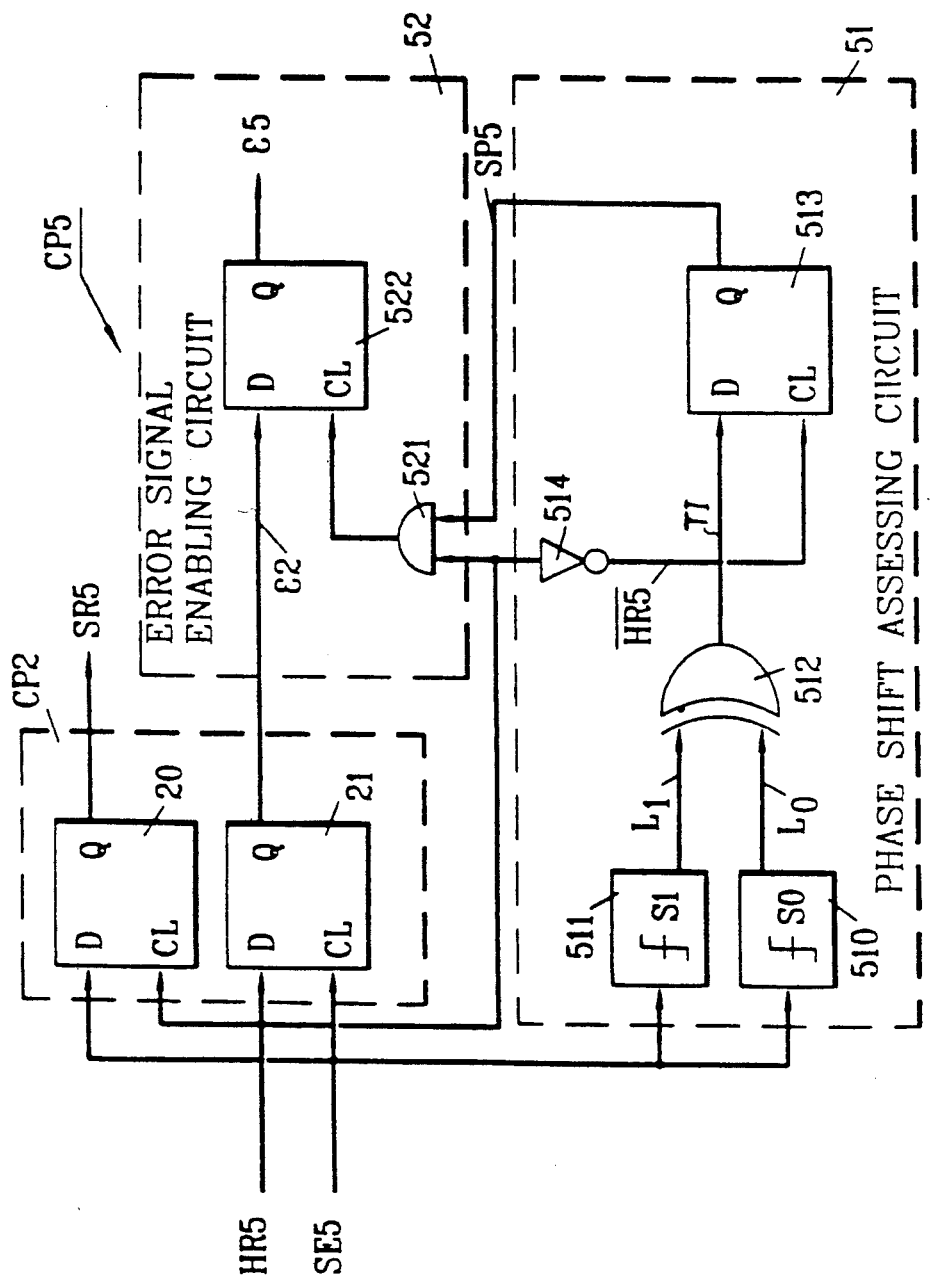
FIG. 5A is a block diagram of a first sign-type phase/frequency comparator embodying the invention.

In reference to FIG. 5A, a phase/frequency comparator CP5 embodying the invention comprises the known sign-type phase comparator CP2 including the flip-flops 20 and 21 and deriving the first error signal $\epsilon 2$, as well as a phase shift assessing circuit 51 deriving a phase detection signal SP5 and an error signal enabling circuit 52 modifying the first error signal $\epsilon 2$.

The phase detection signal SP5 derived in circuit 51 is applied to the circuit 52. The signal SP5 is in the state "1" when the falling edges of the recovered clock signal HR5 coincide with a predetermined interval $2\Delta\Theta$ centered on falling and rising edges delimiting the binary elements of the input signal SE5. This means that the phase shift $\Delta\Phi$, also called phase error, between the digital input signal SE5 and the recovered clock signal HR5 is included within the predetermined limits $-\Delta\Theta$ and $+\Delta\Theta$, i.e., varies around a stable equilibrium phase. In practice, the phase interval $2\Delta\Theta$ is determined as a function of transition times between the logic states "0" and "1" in the input signal SE5.

The circuit 51 comprises means for detecting transitions in the input signal SE5 and means for deriving a phase detection signal signalling the relative phase of the recovered clock signal HR5 with regard to the transitions, to within $\pm\Delta\Theta$.

The transition detecting means comprise two threshold comparators 510 and 511 and an XOR gate 512. The comparators 510 and 511 receive the input signal SE5 which is also applied to inputs D and CL of the flip-flops 20 and 21 respectively. The signal SE5 is compared with two voltage thresholds S0 and S1 in the comparators 510 and 511 which are such that:

$$V0 < S0 < VM \text{ and } VM < S1 < V1$$

with $VM = (V0+V1)/2 = (S0+S1)/2$.

In the previous relations, as shown in FIG. 2B, V0 and V1 denote reference voltages corresponding to the upper and lower logic states "0" and "1" in the signal SE5, and VM the mean voltage between the voltages V0 and V1. The thresholds S0 and S1 are also symmetrical with regard to the mean voltage VM. When the voltage at input of a threshold comparator 510, 511 is more than the corresponding threshold S0, S1, the logic signal L1, L0 leaving the comparator and applied to a respective input of the gate 512 is in the HIGH state "1". As a result, the output of the XOR gate 512 produces pulses TI in response to each rising or falling edge, in the signal SE5. On average, the width of the transition pulses TI is equal to $2\Delta\Theta$.

The phase detection signal deriving means signalling the recovered clock relative phase in the circuit 51 are in the form of a D-type flip-flop 513 and an inverter 514. The recovered clock signal HR5 is applied to the clock input CL of the flip-flop 513 via the inverter 514, as well as to the inputs CL and D of the flip-flops 20 and 21. The output of the gate 512 is connected to the input D of the flip-flop 513. The output Q of the flip-flop 513 produces the phase detection signal SP5. As shown on the second line of FIG. 5B, when the signal $\overline{HR5}$, which is the complement of the clock signal HR5 and produced by the inverter 514, has rising edges included within the width $2\Delta\Theta$ of the pulses TI, the signal SP5 is in the state "1".

The error signal enabling circuit 52 comprises a two-input AND gate 521 and a D-type flip-flop 522. The inputs of the gate 521 respectively receive the signals HR5 and SP5. The output of the gate 521 is connected to the clock input CL of the flip-flop 522 and reproduces at least one period of the clock signal HR5 in response to the state "1" of the phase detection signal SP5. The output Q of the flip-flop 21 producing the first error signal $\epsilon 2$ leaving the phase comparator CP2 is connected to the input D of the flip-flop 522 of which the output Q produces the second error signal $\epsilon 5$.

In this way, when the signal SP5 is in the state "1", the gate 521 is open, and the flip-flop 522 reads the sign of the error signal $\epsilon 2$ while reproducing it.

Figure 5D:
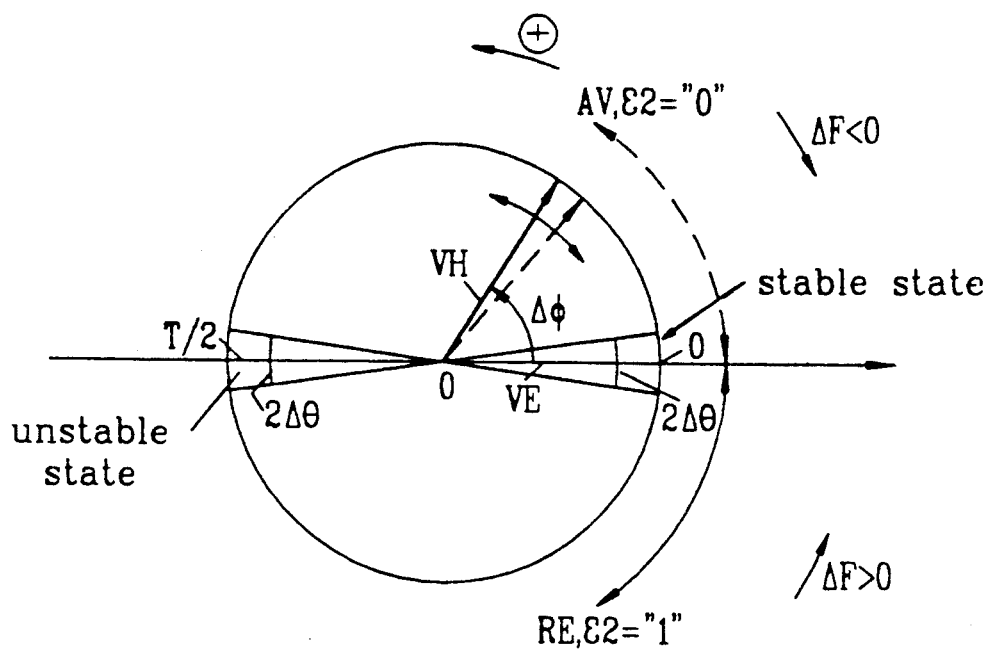
FIG. 5D is a phase diagram relating to the comparator in FIG. 5A.

FIG. 5D shows a a phase diagram relating to the functioning of the comparator CP5 embodying the invention. The signals are represented in vector form in this diagram which indicates a relative phase shift $\Delta \phi$ between the digital input signal SE5 represented by a fixed vector VE, and the recovered clock signal HR5 represented by a vector VH rotating as a function of time. More precisely, the position of the vector VE represents the middle phase of a modulo-$2\pi$ logic transition of the input signal SE5, and the position of the vector VH represents the phase of a rising edge of the complementary clock signal $\overline{HR5}$. The phase shift $\Delta \phi$ is thus represented by an angle orientated between the vector VE and the vector VH. It is presupposed hereinafter that a frequency difference $\Delta F5$ between a frequency FH5 of the recovered clock signal HR5 and the frequency FE5=1/TE of the input signal SE5 is very small by comparison with said frequency FE5 of the input signal. Nevertheless, the comparator CP5 functions for a wide frequency acquisition range compared with the prior art. Information will be provided hereinafter for determining an upper limit for a frequency difference $\Delta F5$ in order to enable proper functioning of a timing recovering circuit including the comparator CP5.

As shown on a third line of FIG. 2B, it is recalled that the first error signal $\epsilon 2$ is in the state "0" when the clock signal HR5 is in advance AV with regard to the input signal SE5, which is translated by a positive anti-clockwise rotation of the vector VH, and in the state "1" when the signal HR5 is retarded RE by comparison with the signal SE5, which is translated by a negative clockwise rotation of the vector VH.

The width $2\Delta\Theta$ of the transition pulses TI produced at each transition of the signal SE5 by the transition detecting means 510-511-512 is represented by an angle $2\Delta\Theta$ in the phase diagram. In fact, the vector VE corresponds to the middle of a transition of the input signal, to within modulo-$2\pi$, and a pulse width can therefore be translated by an angle in the phase diagram. When the vector VH belongs to this angle, the signal SP5 is then in the state "1".

Such a widely used representation for analog signals is valid in this instance subject to the hypothesis that the frequency difference $\Delta F5$ is very small by comparison with the frequency of the input signal SE5.

When the frequency FH5 of the recovered clock signal HR5 is lower than the frequency FE5=1/TE of the input signal SE5 and tends towards the frequency FE5, the clock vector VH rotates anti-clockwise. The rising edges of the clock signal HR5 shift phase at each clock period by a relative frequency difference of $+(\Delta F5/FE5)2\pi$ with regard to the input signal SE5. In this way, at the start of an acquisition phase, e.g. when the frequency difference $\Delta F5$ is positive and the recovered clock signal HR5 initially has a phase lag RE then represented by a negative phase shift $\Delta \phi$ with a decreasing modulus, the error signal $\epsilon 2$ is then in the state "1" and the vector VH rotates anti-clockwise. The phase detection signal SP5 is then in the state "0". When the rotating vector VH is positioned in the first angular half-difference $-\Delta\Theta$, rising edges of the complementary clock signal $\overline{HR5}$ coincide with transition pulses TI of the signal SE5. The enabling signal switches to the state "1", the AND gate 521 is open and the error signal $\epsilon 2$ is then reproduced at output Q of the flip-flop 522 precisely by the error signal $\epsilon 5$, in the state "1".

Then the rotating vector VH representing the phase of the complementary clock signal $\overline{HR5}$ moves into a second angular half-difference $+\Delta\Theta$, the error signal $\epsilon 5$ at output of the phase comparator CP2 switches into the state "0", the phase detection signal SP5 is still in the state "1" and the AND gate 521 is open. In response to a rising edge of the clock signal HR5 succeeding the change of state of the error signal $\epsilon 2$, the error signal $\epsilon 5$ switches to the state "0" and is held in this state as long as the rotating clock vector VH is within the angular difference $[0, T-\Delta\Theta]$, i.e., until the next crossing of the rotating vector VH into the angular half-difference $-\Delta\Theta$.

In this way, for a positive frequency difference, the second error signal $\epsilon 5$ is held in the state "0", except for a width of a half-pulse $-\Delta\Theta$, as and from a transition of the phase detection signal SP5 into the state "1" corresponding to a coinciding of the rising edges of the complementary clock signal $\overline{HR5}$ with pulses TI.

When the frequency FH5 of the recovered clock signal is greater than the frequency FE5=1/TE of the input signal SE5 and tends towards the frequency FE5, a result complementing the previous result and corresponding to a negative frequency difference $-(\Delta F5/FE5)2\pi$ leads to the error signal $\epsilon 5$ being held in the state "1" except for a pulse half-width TI/2 corresponding to phase shift $+\Delta\Theta$.

The second error signal "essentially" in the state "0" and in the state "1" respectively for positive and negative frequency differences is applied to the voltage-controlled oscillator VCO via the filter FP to slave the frequency FH5 of the recovered clock HR5 to the frequency FE5 of the signal.

For the comparator CP5 to function properly, the second error signal $\epsilon 5$ must be "very quickly" put into the state "1" or "0" to properly slave the voltage-controlled oscillator VCO to the frequency of the signal, i.e., during a first crossing of the rotating vector VH into an angular half-difference $(+\Delta\Theta)$ or $(-\Delta\Theta)$, and therefore requires wide angular half-differences for wide frequency acquisitions.

However, the pulse widths TI must also be as small as possible to enable the voltage-controlled oscillator VCO to function properly. In practice, frequency acquisition "widths" of approximately ten times the size of those of the prior art are obtained.

Figure 5E:
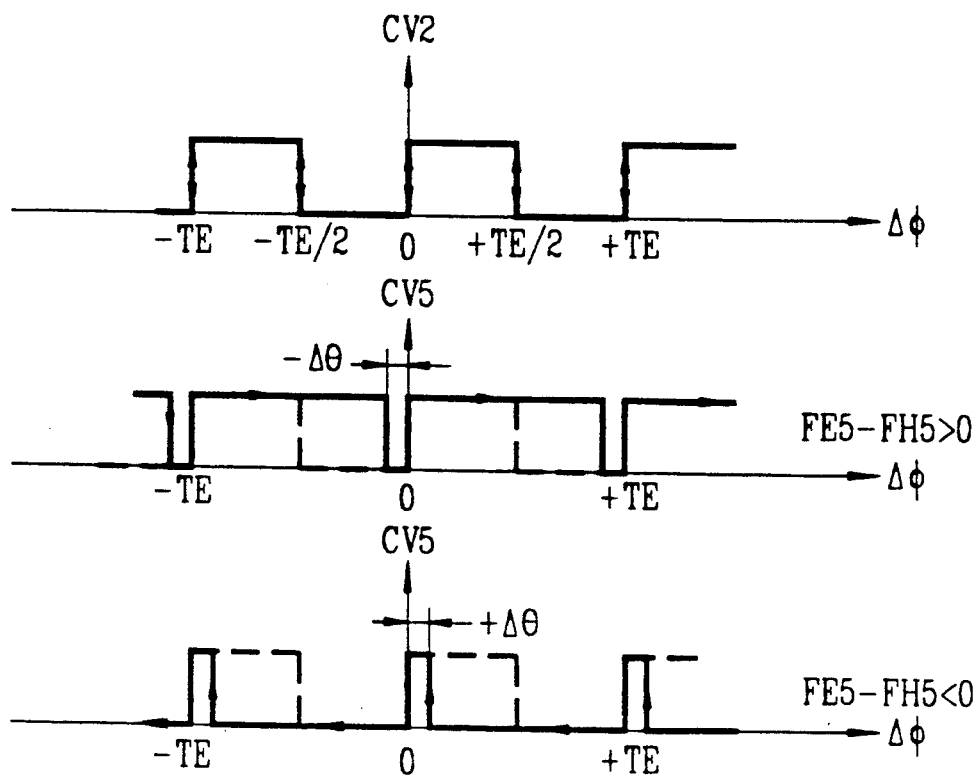
FIG. 5E shows three diagrams of oscillator control signal as a function of the phase shift between input signal and clock signal, respectively, relating to the phase comparator of FIG. 2A and to positive and negative frequency differences between input signal and clock signal for the phase/frequency comparator in FIG. 5A.

The first line of FIG. 5E shows the characteristic of the error signal $\epsilon 2$ obtained at output of the phase comparator CP2 for a positive and negative frequency difference between the recovered clock signal HR2 and the input signal SE2. The X-axis designates the phase shift $\Delta\phi$ between the clock signal HR2 and the input signal SE2. This characteristic is interpreted as follows:
  in the case of a positive frequency difference, the error signal $\epsilon 2$ is obtained by "following" the characteristic from right to left as a function of the phase shift $\Delta\phi$ developing over time;
  in the case of a negative frequency difference, the curve is "followed" from left to right.

The second and third lines of FIG. 5E respectively show the characteristics of the second error signal $\epsilon 5$ obtained for a positive frequency difference and for a negative frequency difference. In other words, the voltage-controlled oscillator VCO receives a control signal CV5 via the filter FP to properly slave the recovered clock HR5 to the frequency of the input signal SE5.

The signal CV5 depends on the error signal ε5 at output of the comparator CP5 which can be in the state "1" or "0" for a positive frequency difference and for a negative frequency difference.

Figure 6:
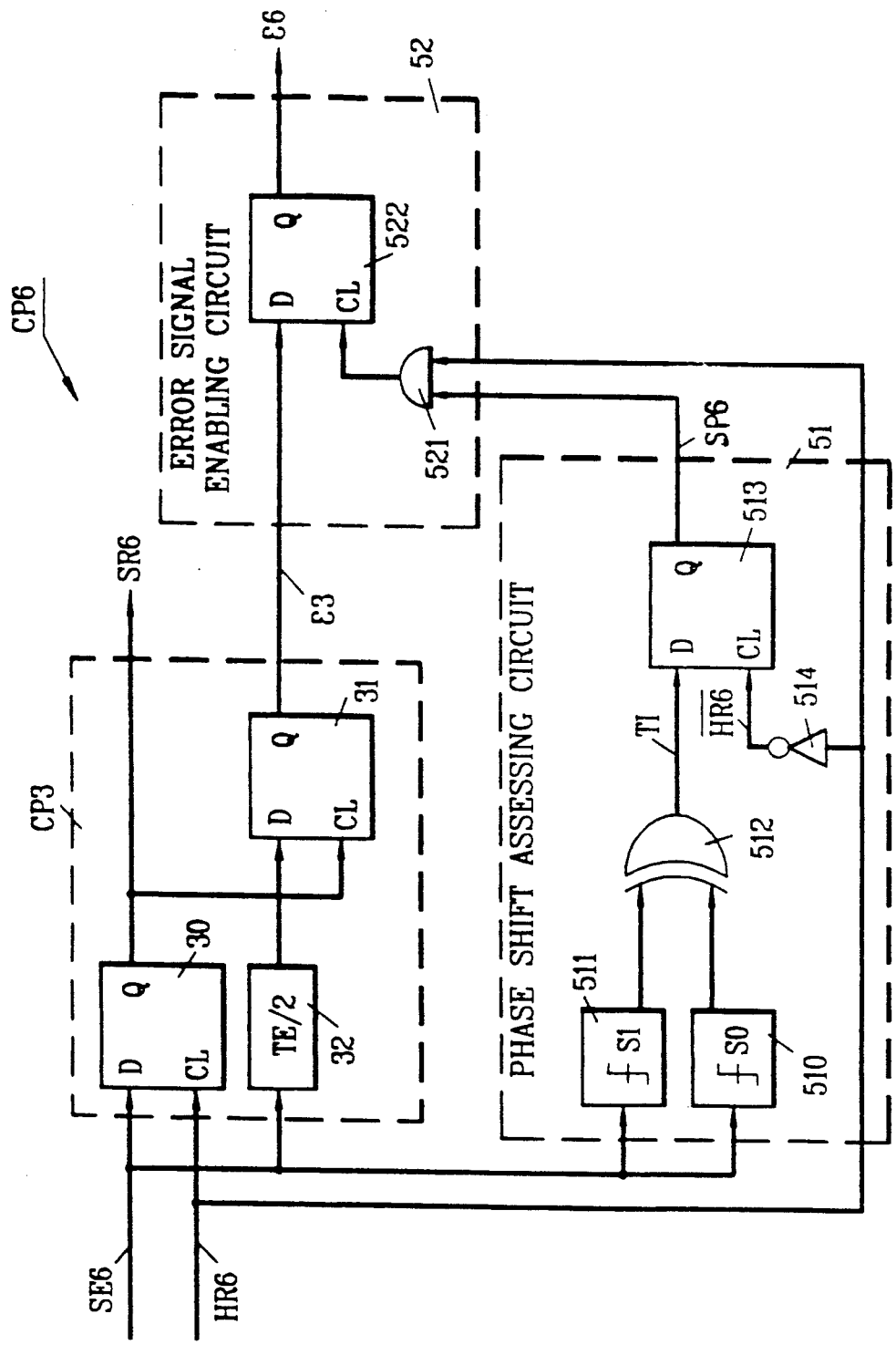
FIG. 6 is a block diagram of a second sign-type phase/frequency comparator embodying the invention.

In another embodiment, another sign-type phase/frequency comparator CP6 comprises the comparator CP3 shown in FIG. 3, the phase shift assessing circuit 51 and the phase detecting circuit 52 as shown in FIG. 6. The circuits 51 and 52 are arranged as in FIG. 5. The digital input signal SE6 is applied to input D of the flip-flop 30, to the input of the delay line 32 and to the inputs of the threshold comparators 510 and 511. The recovered clock signal HR6 is applied to the clock input CL of the flip-flop 30, to the inverter 514 and to an input of the AND gate 521. Output Q of the flip-flop 30 supplies a regenerated signal SR6. Output Q of the flip-flop 31 supplies the first error signal ε3 and is connected to input D of the flip-flop 522. Output Q of the flip-flop 522 delivers second error signal ε6 leaving the comparator CP6. The same characteristics as those shown in FIG. 5E are obtained for the control signal as a function of a positive or negative frequency difference F6.

Phase/frequency comparators embodying the invention including a linear phase comparator, called Hogge comparator, will now be described.

Figure 7A:
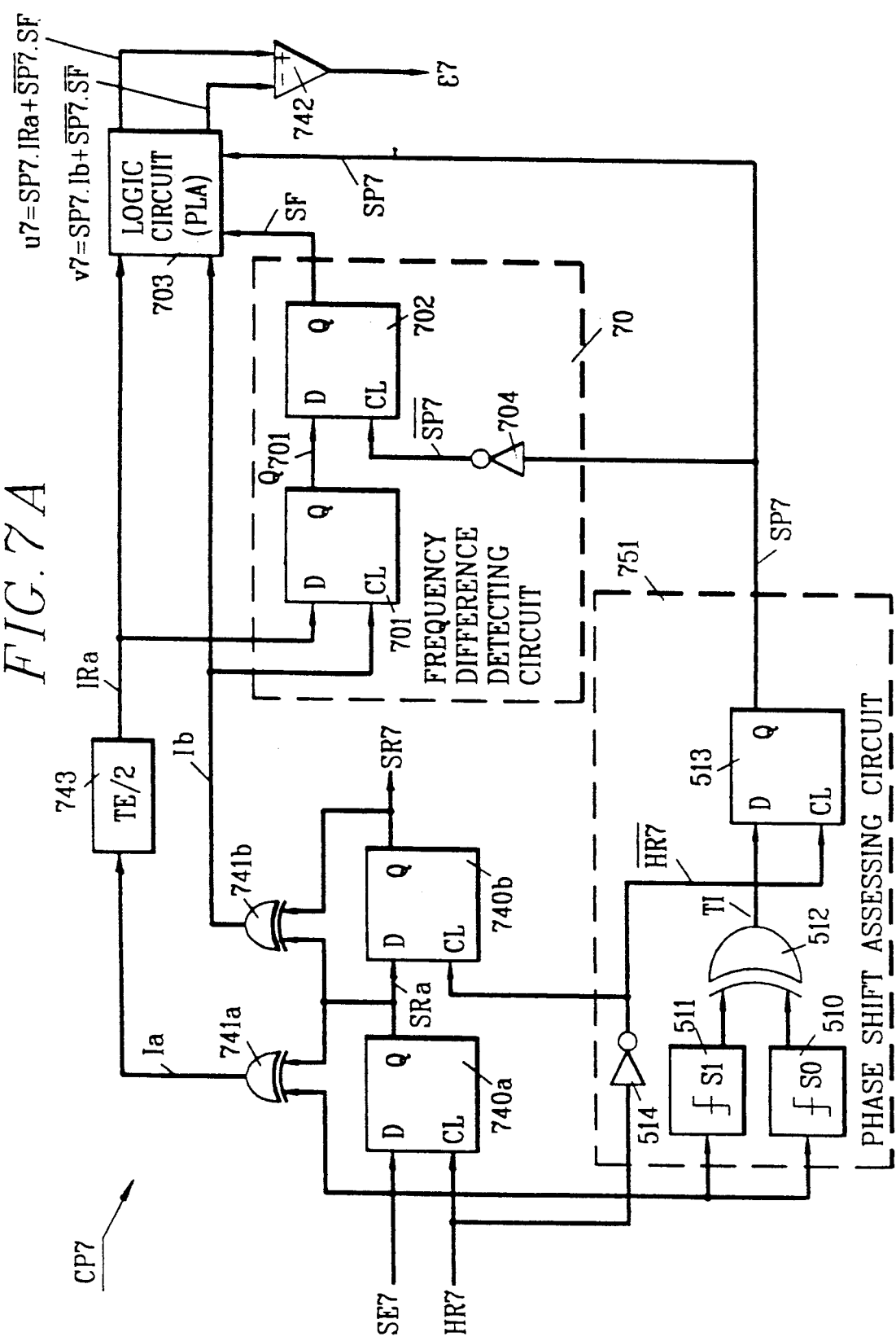
FIG. 7A is a block diagram of a first linear-type phase/frequency comparator embodying the invention.

In reference to FIG. 7A, a first phase/frequency comparator CP7 comprises two flip-flops 740a and 740b, two XOR gates 741a and 741b and a delay line 743 arranged like the elements 40a, 40b, 41a and 41b, and 43 in the linear phase comparator CP4. The comparator CP7 also comprises a phase shift assessing circuit 751 in which elements 510 to 514 of the assessing circuit 51 in FIG. 5A are again found. The digital input signal SE7 is thus applied to an input of the gate 741a, to input D of the flip-flop 740a and to the inputs of the threshold comparators 510 and 511 in the circuit 751, and the recovered clock signal HR7 is applied to input CL of the flip-flop 740a and, via the inverter 514 which also serves as an inverter 44 (FIG. 4A), to inputs CL of the flip-flops 740b and 513.

The comparator CP7 further comprises a frequency difference sign detecting circuit 70, a logic circuit 703 and a differential amplifier 742 producing a second error signal ε7. The detecting circuit 70 comprises two flip-flops 701 and 702 in cascade. Inputs D and CL of the flip-flop 701 respectively receive the signal IRa coming from the delay line 743 and the signal Ib coming from the gate 741b, the signals IRa and Ib being representative of the first error signal ε4. Output Q of the first flip-flop 701 is connected to input D of the second flip-flop 702 and produces an advance/lag signal $Q_{701}$ of which the states are representative of the advance (AV) and retardation (RE) of the clock signal HR7 with regard to the input signal. The clock input CL of the flip-flop 702 receives a phase detection signal $\overline{SP7}$ coming from the flip-flop 513, identical to the signal SP5 derived by the circuit 51, via inverter 704. Output Q of the flip-flop 702 produces a frequency difference sign signal SF which is as a function of the directions of the logic transitions detected in the advance/lag signal $Q_{701}$ when the signal SP7 is in the state "1". The logic circuit 703, which is of the programmable logic array (PLA) type, receives the signals IRa and Ib to two first inputs, and the frequency difference sign signal SF and the phase signal SP7 to two second inputs so as to produce logic signals u7 and v7 from respective outputs such that:

$u7 = SP7.IRa + \overline{SP7}.SF$ $v7 = SP7.Ib + \overline{SP7}.\overline{SF}.$ The signals u7 and v7 and respectively applied to the direct and inverse inputs of the differential amplifier 742 which is equivalent to the amplifier 42 in the phase comparator CP4 (FIG. 4A).

The functioning of the comparator CP7 will now be more precisely described in reference to FIGS. 7B, 7C, 7D and 7E.

As previously stated, the phase detection signal SP7 is identical to the phase detection signal SP5 in FIG. 5A. The signal SP7 moves into a HIGH state "1" when a rising edge of the complementary signal $\overline{HR7}$ coincides with a pulse TI, i.e., in the region of 2ΔΘ of a stable state for which the signals HR7 and SE7 are deemed to be in phase.

Figure 7C:
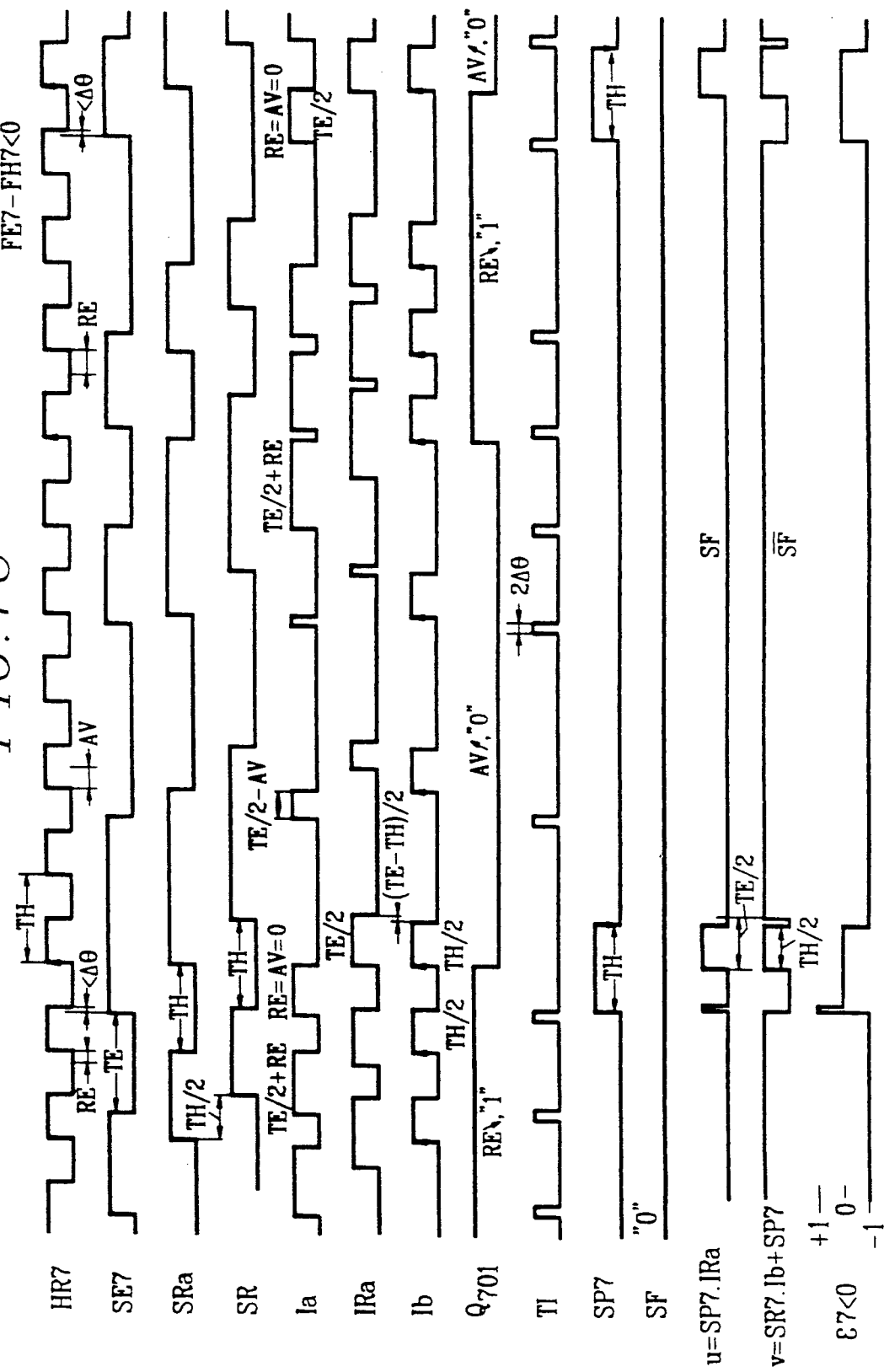

The timing diagrams in FIGS. 7B and 7C respectively concern a clock signal HR7 having a frequency FH7 lower than that FE7 of the input signal SE7, i.e., a frequency difference of ΔFE=FE7−FH7>0, and a clock signal HR7 having a frequency FH7 greater than that FE7 of the input signal S7, i.e., a frequency difference of ΔF7=FE7−FH7<0. The signal $Q_{701}$ from the output of the flip-flop 701 is cyclically in the state "0" when the phase of the clock signal is in advance AV, and in the state "1" when the clock signal is phase retarded RE.

In reference to the phase diagram in FIG. 5D combined with FIG. 7B, for a positive frequency difference ΔF7, since the rotating vector VH represents the phase of a rising edge of the complementary signal $\overline{HR7}$ varying as a function of time, vector VH rotates cyclically anti-clockwise to move from a phase advance to a phase lag. In other words, the phase advance decreases and the phase lag increases on either side of a quasi-zero phase shift, to within ±ΔΘ, signalled by a rising edge of the advance/lag signal $Q_{701}$ from output of the flip-flop 701. The rising edge of the signal $Q_{701}$ is inscribed within a crenel of the phase signal SP7 signalling a momentary phasing. The second flip-flop 702 in the circuit 70 reads the state of the signal $Q_{701}$ subsequent to the phasing passage so as to produce at its output Q, with the help of the complementary signal $\overline{SP7}$, a signal SF in the state "1" which is indicative of the positive sign of the frequency difference FE5−FH5.

The logic circuit 703 is intended to select pulses IRa and Ib during at least one clock period TH determined by a crenel of the phase signal SP, these pulses having different widths respectively equal the half-period TE/2=1/(2.FE7) of the input signal to within ±ΔΘ, and to the half-period TH/2=1(2.FH7) of the recovered clock signal. The logic circuit 703 receives on the one hand the pulse signals IRa and Ib and on the other hand the signals SF and SP7 to derive two parallel logic signals u7 and v7 such that $u7 = SP7.IRa + \overline{SP7}.SF$ $v7 = SP7.Ib + \overline{SP7}.\overline{SF}$ and, in this instance, for ΔF7>0, i.e. SF="1", such that $u7 = SP7.IRa + \overline{SP7}$ $v7 = SP7.Ib.$ The first signal u7 reproduces a pulse of width TE/2 and the second signal v7 reproduces a pulse of width TH/2 during the duration of a crenel of the sign signal SP7. The signals u7 and v7 are respectively applied to the direct and inverse inputs of the differential amplifier 742 which produces an error signal $\epsilon 7$ of which the magnitude is a function of the difference of the pulse widths (TH−TE)/2 and is positive on average.

Similarly, in reference to FIGS. 5D and 7C, for a negative frequency difference $\Delta F7$, the frequency difference sign signal SF is in the state "0" and results from a passing from a decreasing phase lag RE, signalled by a state "1" of the signal $Q_{701}$, to an increasing phase advance AV, signalled by a state "0" of the signal $Q_{701}$. In this case the rotating vector VH "rotates" anti-clockwise, the rising edges of the phase signal SP7 then coincide with a phase lag and the falling edges coincide with a phase advance. The signal $Q_{701}$ is then sampled in the state "0". The signals u7 and v7 coming from the logic circuit 703 are u7=SP7.IRa v7=SP7.Ib+$\overline{SP7}$.

The second error signal $\epsilon 7$ then has a negative mean magnitude which is a function of the negative frequency difference $\Delta F7$.

The characteristics of the error signal $\epsilon 7$ as a function of the phase shift $\Delta \phi$ are shown in FIGS. 7D and 7E respectively for a positive frequency difference and for a negative frequency difference.

The saw-tooth shaped curve in short broken lines in FIGS. 7D and 7E is indicative of the error signal $\epsilon 4$ of the Hogge comparator or, more precisely, the time mean CV4 of the signal $\epsilon 4$ for a given frequency difference in the Hogge comparator CP4. In fact, for a zero frequency difference $\Delta F4$ between the recovered clock HR4 and the input signal SE4 in the Hogge comparator shown in FIG. 4A, the pulses in the signal $\epsilon 4$ shown in FIGS. 4B and 4C are respectively positive and negative, and the associated time mean CV4 for slaving the phase of the oscillator VCO to the phase of the input signal are respectively a function of the width of these pulses of which the maximum width is equal to TE/2. In this way, when the frequency difference $\Delta F4$ is other than zero, the phase advance changes to a phase lag, with signal $\epsilon 4$ pulses of which the width varies. The associated time mean then follows a straight line between a maximum phase lag (−TE/2) and a maximum phase advance (+TE/2).

In the case of a positive frequency difference $\Delta F7$ in the phase/frequency comparator CP7 embodying the invention, the signals u and v applied to the differential amplifier 742 are such that:

u7=SP7.IRa+$\overline{SP7}$ v7=SP7.Ib and pulses IRa and Ib are therefore "enabled" in the logic circuit 703 when the phase signal SP is in the state "1", i.e., in the region of $\pm \Delta \Theta$ of a stable state with zero phase shift. Outside this region of $\pm \Delta \Theta$ of a stable state, the signal SP7 is in the state "0" and therefore the signals u7 and v7 applied to the inputs of the differential amplifier 742 are such that u7=$\overline{SP7}$.SF "1" and v7=$\overline{SP7}$.$\overline{SF}$"0", which imposes a positive maximum magnitude, proportional to u7−v7="1", on the error signal $\epsilon 7$ and on its time mean CV7 controlling the oscillator VCO.

In this way, for a phase difference $\pm \Delta \Theta$ centered around the stable states, the characteristic of the comparator CP7 is identical to the characteristic of the Hogge comparator CP4 represented by segments of straight line such as shown in FIG. 7D in the intervals [N.TE−$\Delta \Theta$, N.TE+$\Delta \Theta$9 , where N is a positive or negative integer. Outside the phase differences $\pm \Delta \Theta$ centered around the stable states, an amplitude level is obtained from the output of the amplifier 742 when u7="1" and v7="0" being applied to.

Similar results are also obtained for a negative frequency difference $\Delta F7=FE7−FH7$, as shown in FIGS. 7B and 7E. In the region of $+\Delta \Theta$ of a stable phase state, in the intervals [N.TE−$\Delta \Theta$, N.TE+$\Delta \Theta$], the characteristic of the comparator CP7 varies linearly as a function of the phase shift as does that of the Hogge comparator CP4. Outside these intervals, the signals u7 and v7 are such that u7=0 and v7=1, which imposes a negative maximum magnitude on the second error signal $\epsilon 7$ and on its time mean CV7.

FIGS. 7B to 7D clearly show that the output of the differential amplifier 742 properly slaves the frequency of the recovered clock HR7 by means of a voltage signal with sometimes positive and sometimes negative magnitude (polarity) applied to the voltage-controlled oscillator VCO via the active filter FP.

The phase/frequency comparator CP8 illustrated in FIG. 8A is a further embodiment of the comparator CP7.

The phase/frequency comparator CP8 comprises two flip-flops 740a and 740b, two XOR gates 741a and 741b, a TE/2-delay line 743, a frequency difference sign detecting circuit 70, a logic circuit 703, an inverter 704, and a differential amplifier 742 identical to those included in the comparator CP7 and connected up in the same way.

The comparator CP8 also comprises a phase shift assessing circuit 851 comprising the two threshold comparators 510 and 511, the XOR gate 512, the D-type flip-flop 513 and the inverter 514 identical to those included in the circuit 751 and connected up in the same way.

The circuit 851 further comprises a D-type flip-flop 80 and an RS-type flip-flop 81. Like that of the flip-flop 513, input D of the flip-flop 80 is connected to the output of the XOR gate 512. Like the flip-flop 740a, the clock input the flip-flop 80 directly receives the recovered clock signal HR8 which is also applied to the clock inputs of the flip-flops 740b and 513 via the inverter 514. The outputs Q of the flip-flops 513 and 80 are connected to the inputs S and R of the flip-flop 81 and produce a phase signal SP and a phase shift signal SD respectively. Output Q of the flip-flop 81 applies a phase/phase-shift signal SPD to the clock input CL of the second flip-flop 702 in the frequency difference sign detecting circuit 70 via the inverter 704. The outputs Q of the flip-flops 81 and 702 are connected to the second inputs of the logic circuit 703.

The logic circuit 703 thus receives to the two first inputs the signals IRa and Ib respectively coming from the delay line 743 and the XOR gate 741b, and to the second inputs the signal SPD coming from the RS-type flip-flop and the signal SF coming from the output of the frequency difference sign detecting circuit 70, and applies two output signals u8 and v8 respectively to the direct and inverse inputs of the differential amplifier 742.

The functioning of comparator CP8 will now be described mainly with regard to the additional functionality provided by the flip-flops 80 and 81 by comparison with the comparator CP7.

It is recalled that phase signal SP coming from the flip-flop 513 comprises state "1" phase pulses having a width TH when rising edges of the recovered clock signal HR8 coincide with pulses TI from the output of the XOR gate 512, i.e., in the region of a stable state, when the quasi-zero phase shift $\Delta\phi$ between the recovered clock HR8 and the input signal SE8 is smaller than a pulse TI width $2\Delta\phi$. Likewise, the phase shift signal SD from the output Q of the flip-flop 80 comprises state "1" opposite phase pulses during a duration TH when rising edges of the recovered clock signal HR8 coincide with pulse TI, i.e., in the region of a unstable state $\Delta\phi=\pi$ when the rising edges of the recovered clock signal HR8 coincide with pulses of width $2\Delta\Theta$ and therefore with the rising edges of the input signal SE8 to within $\pm\Delta\Theta$. The signal SDP at the output Q of the flip-flop 81 then jumps to the state "1" in response to a stable state and therefore to a phase shift substantially equal to 0 translated by SP="1" and to the state "0" in response to an unstable state and therefore to a phase shift substantially equal to $\pi$ translated by SD="1". The difference sign signal SF from the output of the flip-flop 702 remains unchanged.

The logic circuit 703 in the comparator CP8 performs the same operations as in the comparator CP7 and derives two signals u8 and v8 which are such that, for a positive frequency difference FE8−FH8>0 signalled by SF="1":

$$u8 = SDP.IRa + \overline{SDP}$$

$$v8 = SDP.Ib,$$

and for a negative frequency difference FE8−FH8<0 signalled by SF="0":

$$u8 = SDP.IRa$$

$$v8 = SDP.Ib + \overline{SDP}.$$

During a periodical interval of phase lag [NTE−$\Delta\Theta$, (2N+1)TE/2−$\Delta\Theta$] for SF="1", the signal SDP is in the state "1", and subsequently, the signal u8 reproduces the pulses IRa and the signal v8 reproduces the pulses Ib. The difference between the signals u8−v8 is performed by the differential amplifier in order to produce an second error signal $\epsilon8$ of which the magnitude varies by TE for each phase timing as a function of the difference between the widths of several successive pulses IRa and Ib, instead of the difference between widths of a pulse IRa and a pulse Ib in the comparator CP7. The second error signal $\epsilon8$ is therefore more accurate than the signal $\epsilon7$, and in particular is less dependent on transition absences in the input signal when the latter is comprised of sequences of consecutive bits in the same logic state "1" or "0".

A similar result is obtained during periodical intervals of phase advance [(2N-1)TE/2+$\Delta\Theta$, NTE+$\Delta\Theta$] for SF="0" corresponding to negative frequency differences.

Thus, in reference to FIGS. 8B and 8C, it appears that the time mean CV8 of the second error signal $\epsilon8$ has the characteristics of that relating to the Hogge comparator CP4 only in the region of $\pm\Delta\Theta$ of a stable state, and also varies linearly in increasing order between phase shifts [NTE+$\Delta\Theta$, (2N+1) TE/2−$\Delta\Theta$] when the clock vector VH rotates anti-clockwise corresponding to a positive frequency difference, and in decreasing order between phase shifts [NTE−$\Delta\Theta$, (2N−1) TE/-2$\Delta\Theta$] when the vector VH rotates clockwise corresponding to a negative frequency difference.

As previously stated, the phase/frequency comparator CP8 derives an error signal of which the sign and magnitude vary statistically substantially one half-period of phase shift TE/2 out of two after the recovered clock signal moves into phase with the input signal. This property permits modification of the error signal even when the input signal SE8 does not have a transition in the region of the stable state of phase. More generally, the phase shift assessing circuit detects, in other embodiments of the invention, several predetermined phase shifts between the clock signal and the input signal during several respective clock periods.

This quality can also be introduced in the phase frequency comparators CP5 and CP6 thereby producing crenels in the phase signal SP5, SP6 which are longer than a period TH of the regenerated clock signal, e.g. equal to two or three successive periods TH so as to modify the error signal $\epsilon5$, $\epsilon6$, respectively add pulses of widths TE/2 and TH/2 in the signals u7 and v7, in response to transitions of the input signal in the region of the stable state. In this case, the circuit 51 can be replaced by the circuit 851.

It should be noted that the embodiments described in detail above are given as examples and that other embodiments coming within the scope and the spirit of the invention can be devised by those skilled in the art. In particular, other combinations of logic elements, such as gates and flip-flops, delay lines producing lags proportional to multiples of a nominal value of $\Delta\Theta$, can be used to obtain results similar to those of the phase/frequency comparators described above.

What we claim is:

1. A phase/frequency comparator, for comparing a digital input signal (SE) having a given binary period and a clock signal (HR) having a clock period variable to within a first time interval with respect to said given binary period, comprising:
   (a) phase comparing means (CP) for comparing the respective phases of said digital input signal and said clock signal to produce a first error signal ($\epsilon2$, $\epsilon4$) having a sign that is a function of the sign of the phase difference between said digital input signal and said clock signal;
   (b) phase shift assessing means (51, 751, 851) for producing a phase detection signal (SP) in accordance with a phase shift between said clock signal and said digital input signal that falls within at least one given phase shift range, said phase shift assessing means including:
   (1) means for detecting transitions between logic states in said digital input signal, thereby to derive transition pulses having a width greater than said first time interval; and
   (2) means for deriving from said phase detection signal a pulse having a width equal to at least one clock period in response to a transition pulse substantially in phase with a clock signal complementing said clock signal; and (c) second error signal producing means (52, 703) operable in response to said first error signal and said phase detection signal to produce a second error signal ($\epsilon_5$, $\epsilon_6$, $\epsilon_7$, $\epsilon_8$) the sign of which is a function of the difference between said given binary period and said clock period.

2. Apparatus as defined in claim 1, wherein said phase shift range is substantially equal to zero to within a second time interval that is greater than said first time interval.

3. Apparatus as defined in claim 1, wherein said phase shift assessing means is operable to detect a plurality of phase shifts between said clock signal and said digital input signal, said phase shifts corresponding with a plurality of said phase shift ranges, respectively.

4. Apparatus as defined in claim 2, wherein said phase shift range are generally equal to O and $\pi$ to within a second time interval greater than said first time interval.

5. The phase/frequency comparator as claimed in claim 3, wherein said phase shift assessing means includes means for detecting transitions between logic states in said digital input signal, thereby deriving transition pulses having a width substantially equal to said second time interval, means for deriving a phase pulse having a width equal to at least one clock period in response to a transition pulse substantially in phase with a clock signal complementing said clock signal, means for deriving an opposite phase pulse having a width at least equal to one clock period in response to a transition pulse substantially in phase with said clock signal, and means for deriving a pulse of said phase detection signal substantially between said phase pulse and said opposite phase pulse.

6. The phase/frequency comparator as claimed in claim 1, wherein said second error signal producing means comprises means for reproducing at least one period into a reproduced period of said clock signal in response to the phase detection signal, and means for reading the sign of said first error signal during said at least one period of said clock signal, thereby deriving said second error signal.

7. The phase/frequency comparator as claimed in claim 6, wherein said phase comparing means comprise a flip-flop having a data input receiving said digital input signal, a clock input receiving said clock signal, and an output transmitting said first error signal.

8. The phase/frequency comparator as claimed in claim 6, wherein said phase comparing means comprise a first flip-flop having a data input receiving said digital input signal and a clock input receiving said clock signal, and a second flip-flop having a data input receiving said input signal via a delay line conferring a lag of a binary half-period, a clock input connected to an output of said first flip-flop, and an output transmitting said first error signal.

9. A phase/frequency comparator, for comparing a digital input signal (SE) having a given binary period and a clock signal (HR) having a clock period variable to within a predetermined first time interval with respect to said binary period, comprising:

(a) phase comparing means (CP) for comparing the respective phases of said digital input signal and said clock signal to produce a first error signal ($\Sigma_2$, $\Sigma_4$) having a sign that is a function of the sign of the phase difference between said digital input signal and said clock signal;

(b) phase shift assessing means (51, 751, 851) for producing a phase detection signal (SP) in accordance with a phase shift between said clock signal and said digital input signal that falls within at least one given phase shift range; and (c) second error signal producing means (52, 703) operable in response to said first error signal and said phase detection signal to produce a second error signal ($\epsilon_5$, $\epsilon_6$, $\epsilon_7$, $\epsilon_8$) the sign of which is a function of the difference between said binary period and said clock period;

(d) said phase shift comparing means including means for deriving first and second pulses composing said first error signal, said first pulses having widths that vary as a function of a phase shift between edges of said digital input signal and corresponding edges of said clock signal, and being phase-shifted by a half of said predetermined binary period with regard to said edges of said digital input signal, and said second pulses having widths equal to a half of said clock period and being synchronous with said clock signal;

(e) said second error signal producing means including pulse width comparing means for comparing said widths of said first and second pulses in response to said phase detection signal, thereby deriving a logic sign signal of which the states are representative of the sign of the difference between said given binary period and said clock period, and means for selecting first and second pulses during at least one clock period determined by said phase detection signal, thereby deriving first and second signals, respectively, reproducing said first and second selected pulses contained in said clock period and the state of said sign signal and the opposite state of said sign signal before and after said clock period said first and second signals being applied to said differential amplification means which produces said second error signal.

10. The phase/frequency comparator as defined in claim 9, wherein said pulse width comparing means comprise means receiving said first and second pulses for deriving an advance/lag signal of which said states are representative of said advance and lag of said clock signal with regard to said digital input signal, and means for detecting logic transitions in said advance/lag signal in response to said phase detection signal thereby deriving said sign signal as a function of direction of each transition detected.

11. The phase/frequency comparator as claimed in claim 9, wherein said selecting means include a logic circuit deriving first and second signal such that:

u=SP.IRa+$\overline{SP}$.SF, and v=SP.IB+$\overline{SP}$.$\overline{SF}$ where SP and $\overline{SP}$ denote said phase detection signal and the complementary signal thereof, IRA and IB denote first and second selected pulses, and SF and $\overline{SF}$ denote said sign signal and the complementary signal thereof.

12. A timing recovering circuit comprising a phase/frequency comparator, loop filtering means, and a voltage controlled oscillator combined into a phase locked loop means, said phase/frequency comparator being operable to compare a digital input signal (SE) having a given binary period and a clock signal (HR) having a clock period variable to within a predetermined first time interval with respect to said binary period, comprising:

(a) phase comparing means for comparing the respective phases of said digital input signal and said clock signal generated by said oscillator, thereby deriving a first error signal whose sign is a function of the sign of the phase difference between said digital input signal and said clock signal, (b) means for detecting transitions between logic states in said digital input signal thereby deriving transition pulses having a width substantially equal to a second time interval greater than said first time interval, (c) means for deriving phase detection pulses having a width equal to at least one clock period in response to ones of said transition pulses substantially in phase with a clock signal complementing said clock signal, (d) means for reproducing at least one period of said clock signal into a reproduced period in response to each of said phase detection pulses, and (e) means for reading the sign of said first error signal in response to said reproduced period of said clock signal thereby deriving a second error signal of which the polarity varies as a function of the sign of the difference between said predetermined binary period and said clock period, said second error signal voltage-controlling said oscillator via said filtering means.

13. The phase/frequency comparator as claimed in claim 12, wherein said phase comparing means includes a flip-flop having a data input receiving said digital input signal, a clock input receiving said clock signal, and an output transmitting said first error signal.

14. The phase/frequency comparator as claimed in claim 12, wherein said phase comparing means includes a first flip-flop having a data input receiving said digital input signal and a clock input receiving said clock signal, and a second flip-flop having a data input receiving said digital input signal via a delay line conferring a lag of a binary half-period, a clock input connected to an output of said first flip-flop, and an output transmitting said first error signal.

15. A timing recovering circuit comprising a phase/frequency comparator, loop filtering means, and a voltage controlled oscillator combined into a phase locked loop means, said phase/frequency comparator being operable to compare a digital input signal (SE) having a given binary period and a clock signal (HR) having a clock period variable to within a predetermined first time interval with respect to said binary period, comprising:

(a) means for deriving a first error signal including first pulses having widths that vary as a function of a phase shift between edges of said digital input signal and following corresponding edges of a clock signal generated by said oscillator, and said first pulses being phases shifted by half of said predetermined binary period with regard to said edges of said digital input signal, and second pulses having widths proportional to said clock period;

(b) means for detecting transitions between logic states in said input signal, thereby deriving transition pulses having a width substantially equal to a second time interval that is greater than said first predetermined time interval;

(c) means for deriving phase detection pulses having a width equal to at least one clock period in response to ones of said transition pulses substantially in phase with a second clock signal that is the complement of said clock signal;

(d) pulse width comparing means for comparing said widths of said first and second pulses in response to each of said phase detection pulses, thereby to derive a logic sign signal the states of which are representative of the sign of the difference between said predetermined binary period and said clock period;

(e) means for selecting ones of said first and second pulses during at least one clock period determined by said phase detection pulses, thereby deriving first and second signals respectively reproducing said first and second selected pulses contained in said at least one clock period and the state of said sign signal and the opposite state of said sign signal before and after said at least one clock period; and (f) means for differentially amplifying said first and second signals, thereby deriving a second error signal voltage-controlling said oscillator via said filtering means, said second error signal having polarity that varies as a function of the sign of the difference between said predetermined binary period and said clock period.

16. The phase/frequency comparator as claimed in claim 15, wherein said pulse width comparing means includes means receiving said first and second pulses for deriving an advance/lag signal the states of which are representative of said advance and lag of said clock signal with regard to said digital input signal, and means for detecting logic transitions in said advance/lag signal in response to said phase detection signal, thereby deriving said sign signal as a function of the direction of said detected transitions.

17. A timing recovering circuit comprising a phase/frequency comparator, loop filtering means and a voltage controlled oscillator combined into a phase locked loop means, said phase/frequency comparator being operable to compare a digital input signal (SE) having a given binary period and a first clock signal (HR) having a clock period variable to within a predetermined first time interval with respect to said binary period, comprising:

(a) means for deriving a first error signal including first pulses having widths that vary as a function of a phase shift between edges of said digital input signal and following corresponding edges of a clock signal generated by said oscillator, and said first pulses being phase shifted by one half of said predetermined binary period with regard to said edges of said digital input signal, and second pulses having widths proportional to said clock period;

(b) means for detecting transitions between logic states in said input signal thereby deriving transition pulses having a width substantially equal to a second predetermined time interval more than said first predetermined time interval;

(c) means for deriving phase detection pulses having a width equal to at least one clock period in response to ones of said transition pulses substantially in phase with a second clock signal that is the complement of said first clock signal;

(d) means for deriving opposite phase pulses having a width at least equal to one clock period in response to ones of said transition pulses substantially in phase with said clock signal;

(e) means for deriving phase detection pulses substantially between said phase pulses and said opposite phase pulses;

(f) pulse width comparing means for comparing said widths of said first and second pulse in response to each of said phase detection pulses thereby deriving a logic sign signal the states of which are representative of the sign of the difference between said predetermined binary period and said clock period;

(g) means for selecting ones of said first and second pulses during at least one clock period determined by said phase detection pulses thereby deriving first and second signals respectively reproducing said first and second selected pulses contained in said at least one clock period and the state of said sign signal and the opposite state of said sign signal before and after said at least one clock period; and (h) means for differentially amplifying said first and second signals, thereby deriving a second error signal voltage-controlling said oscillator via said filtering means, said second error signal having a polarity that varies as a function of the sign of the difference between said binary period and said clock period.

18. The phase/frequency comparator as claimed in claim 17, wherein said pulse width comparing means includes means receiving said first and second pulses for deriving an advance/lag signal of which said states are representative of said advance and lag of said first clock signal with regard to said digital input signal, and means for detecting logic transitions in said advance/lag signal in response to said phase detection signal, thereby deriving said sign signal as a function of direction of said detected transitions.

* * * * *

UNITED STATES PATENT AND TRADEMARK OFFICE
CERTIFICATE OF CORRECTION

PATENT NO. : 5,297,173
DATED : Mar. 22, 1994
INVENTOR(S) : Hikmet Sari and Hervé F. Houeix It is certified that error appears in the above-indentified patent and that said Letters Patent is hereby corrected as shown below:

On title page, item [75] should read as follows:

-- [75] Hikmet Sari, Creteil; Hervé F. Houeix, Lannion, both of France --

Item [19] "Hikmet" should read --Sari--.

Signed and Sealed this

Fifth Day of July, 1994

Attest:

BRUCE LEHMAN

*Attesting Officer*　　　*Commissioner of Patents and Trademarks*